(12) United States Patent
Ferrara et al.

(10) Patent No.: US 12,352,868 B1
(45) Date of Patent: Jul. 8, 2025

(54) SYSTEMS AND METHODS OF LIDAR SENSOR SYSTEMS HAVING INTEGRATED SEMICONDUCTOR DEVICES

(71) Applicant: Aurora Operations, Inc., Mountain View, CA (US)

(72) Inventors: James Ferrara, Oakland, CA (US); Pruthvi Jujjavarapu, Palo Alto, CA (US); Yongxuan Edward Liang, Fremont, CA (US); Sen Lin, Mountain View, CA (US); Zhizhong Tang, Palo Alto, CA (US)

(73) Assignee: AURORA OPERATIONS, INC., Pittsburgh, PA (US)

(*) Notice: Subject to any disclaimer, the term of this patent is extended or adjusted under 35 U.S.C. 154(b) by 0 days.

(21) Appl. No.: 18/109,125

(22) Filed: Feb. 13, 2023

(51) Int. Cl.
*H01L 25/16* (2023.01)
*B60W 10/18* (2012.01)
(Continued)

(52) U.S. Cl.
CPC ............ *G01S 17/931* (2020.01); *B60W 10/18* (2013.01); *B60W 10/20* (2013.01); *B60W 60/001* (2020.02); *G01S 7/4817* (2013.01); *G01S 17/58* (2013.01); *H01L 23/481* (2013.01); *H01L 25/167* (2013.01); *B60W 2420/408* (2024.01); *B60W 2554/4042* (2020.02); *B60W 2554/802* (2020.02); *H01L 24/14* (2013.01); *H01L 24/16* (2013.01); *H01L 24/48* (2013.01); *H01L 24/73* (2013.01); *H01L 2224/14181* (2013.01); *H01L 2224/16145* (2013.01);
(Continued)

(58) Field of Classification Search
CPC . H01L 33/647; H01L 23/4926; H01L 23/538; H01L 23/5384; H01L 23/49568; H01S 3/0405; H01S 5/024; H01S 5/02469; H01S 5/2206; H01S 5/2207; H01S 5/2209
See application file for complete search history.

(56) References Cited

U.S. PATENT DOCUMENTS

| | | |
|---|---|---|
| 11,378,664 B1 | 7/2022 | Tang et al. |
| 2002/0003232 A1* | 1/2002 | Ahn ...................... H01L 25/167 |
| | | 257/E25.032 |

(Continued)

OTHER PUBLICATIONS

International Search Report and Written Opinion issued in connection with PCT/US2023/085322 dated May 1, 2024.

*Primary Examiner* — Jesse Y Miyoshi
(74) *Attorney, Agent, or Firm* — Dority & Manning, P.A.

(57) ABSTRACT

A light detection and ranging (LIDAR) sensor system includes a circuit module. The circuit module includes a silicon substrate having a first thermal feature. The circuit module includes a III-V semiconductor substrate coupled to the silicon substrate, the III-V semiconductor substrate having a second thermal feature. The circuit board includes an optical device coupled to the III-V semiconductor substrate, the optical device configured to output a transmit beam. The circuit module further includes a plurality of vias disposed in a particular portion of the silicon substrate, where the particular portion corresponds to the III-V semiconductor substrate, at least one of the plurality of vias having a third thermal feature. The LIDAR system further includes a scanner configured to direct the transmit beam to an environment of the vehicle.

19 Claims, 17 Drawing Sheets

(51) Int. Cl.
*B60W 10/20* (2006.01)
*B60W 60/00* (2020.01)
*G01S 7/481* (2006.01)
*G01S 17/58* (2006.01)
*G01S 17/931* (2020.01)
*H01L 23/00* (2006.01)
*H01L 23/48* (2006.01)

(52) U.S. Cl.
CPC ............... *H01L 2224/48145* (2013.01); *H01L 2224/73207* (2013.01); *H01L 2224/73257* (2013.01)

(56) References Cited

U.S. PATENT DOCUMENTS

| | | | |
|---|---|---|---|
| 2010/0271614 A1 | 10/2010 | Albuquerque et al. | |
| 2012/0007132 A1* | 1/2012 | Chang | H01L 33/647 |
| | | | 438/712 |
| 2017/0047312 A1* | 2/2017 | Budd | H01L 23/585 |
| 2018/0113200 A1* | 4/2018 | Steinberg | G01S 17/10 |
| 2019/0004394 A1 | 1/2019 | Shin et al. | |
| 2019/0243064 A1* | 8/2019 | Menezo | G02B 6/136 |
| 2019/0387185 A1* | 12/2019 | Hicks | G06V 20/58 |
| 2020/0235053 A1* | 7/2020 | Aygun | H01L 23/522 |
| 2022/0200235 A1 | 6/2022 | Yeh et al. | |
| 2022/0204339 A1 | 6/2022 | Lee et al. | |

\* cited by examiner

1100

| Material | CTE at room temperature (ppm) |
|---|---|
| Silicon | 2.6 |
| GaAs | 5.7 |
| InP | 4.5 |
| Cu | 16 |

SYSTEMS AND METHODS OF LIDAR SENSOR SYSTEMS HAVING INTEGRATED SEMICONDUCTOR DEVICES

BACKGROUND

Optical detection of range using lasers, often referenced by a mnemonic, LIDAR (for "light detection and ranging"), also sometimes referred to as "laser RADAR," is used for a variety of applications, including imaging and collision avoidance. LIDAR provides finer scale range resolution with smaller beam sizes than conventional microwave ranging systems, such as radio-wave detection and ranging (RADAR).

SUMMARY

At least one aspect relates to a light detection and ranging (LIDAR) sensor system for a vehicle. The LIDAR system includes a circuit module. The circuit module includes a silicon substrate having a first thermal feature (e.g., a thermal property, a thermomechanical property, etc.). The circuit module includes a III-V semiconductor substrate coupled to the silicon substrate, the III-V semiconductor substrate having a second thermal feature. The circuit board includes an optical device disposed on the III-V semiconductor substrate, the optical device configured to output a transmit beam. The circuit module further includes a plurality of vias disposed in a particular portion of the silicon substrate, where the particular portion corresponds to the III-V semiconductor substrate, at least one of the plurality of vias having a third thermal feature. The LIDAR system further includes a scanner configured to direct the transmit beam to an environment of the vehicle.

At least one aspect relates to an autonomous vehicle control system. The autonomous vehicle control system includes a LIDAR sensor system. The LIDAR sensor system includes a circuit module that includes a silicon substrate having a first thermal feature. The circuit module includes a III-V semiconductor substrate coupled to the silicon substrate, the III-V semiconductor substrate having a thermal feature. The circuit module includes an optical device coupled to the III-V semiconductor substrate, the optical device configured to output a transmit beam. The circuit module further includes a plurality of vias disposed in a particular portion of the silicon substrate that corresponds to the III-V semiconductor substrate, each via having a third thermal feature. The LIDAR sensor system further includes a scanner configured to direct the transmit beam to an environment of the vehicle. The autonomous vehicle control system further includes one or more processors configured to determine at least one of a range to the object or a velocity of an object based on a return beam from at least one of reflection or scattering of the transmit beam by the object and control operation of an autonomous vehicle based on the at least one of the range or the velocity.

At least one aspect relates to an autonomous vehicle. The autonomous vehicle includes a LIDAR sensor system. The LIDAR sensor system includes a circuit module that includes a silicon substrate having a first thermal feature. The circuit module includes a III-V semiconductor substrate coupled to the silicon substrate, the III-V semiconductor substrate having a thermal feature. The circuit module includes an optical device coupled to the III-V semiconductor substrate, the optical device configured to output a transmit beam. The circuit module further includes a plurality of vias disposed in a particular portion of the silicon substrate that corresponds to the III-V semiconductor substrate, each via having a third thermal feature. The LIDAR sensor system further includes a scanner configured to direct the transmit beam to an environment of the vehicle. The autonomous vehicle includes a steering system. The autonomous vehicle includes a braking system. The autonomous vehicle further includes a vehicle controller having one or more processors configured to determine at least one of a range to the object or a velocity of an object based on a return beam from at least one of reflection or scattering of the transmit beam by the object and control operation of at least one of the steering system or the braking system based on the at least one of the range or the velocity.

At least one aspect relates to a LIDAR sensor system. The LIDAR sensor system includes a circuit module. The circuit module includes a silicon substrate having a first thermal feature. The circuit module includes a III-V semiconductor substrate coupled to the silicon substrate at a bonding interface, the III-V semiconductor substrate having a second thermal feature. The bonding interface includes a metal bonding layer coupled to the silicon substrate and the III-V semiconductor substrate, the metal bonding layer having a third thermal feature. The circuit module further includes an optical device coupled to the III-V semiconductor substrate, the optical device configured to output a transmit beam. The LIDAR sensor system further includes a scanner configured to direct the transmit beam to an environment of the vehicle.

Those skilled in the art will appreciate that the summary is illustrative only and is not intended to be in any way limiting. Any of the features described herein may be used with any other features, and any subset of such features can be used in combination according to various embodiments. Other aspects, inventive features, and advantages of the devices and/or processes described herein, as defined solely by the claims, will become apparent in the detailed description set forth herein and taken in conjunction with the accompanying drawings.

BRIEF DESCRIPTION OF THE DRAWINGS

Implementations are illustrated by way of example, and not by way of limitation, in the figures of the accompanying drawings in which like reference numerals refer to similar elements and in which:

FIG. 11 is a table of example materials and their corresponding coefficient of thermal expansion (CET) at room temperature;

DETAILED DESCRIPTION

Figure 1:
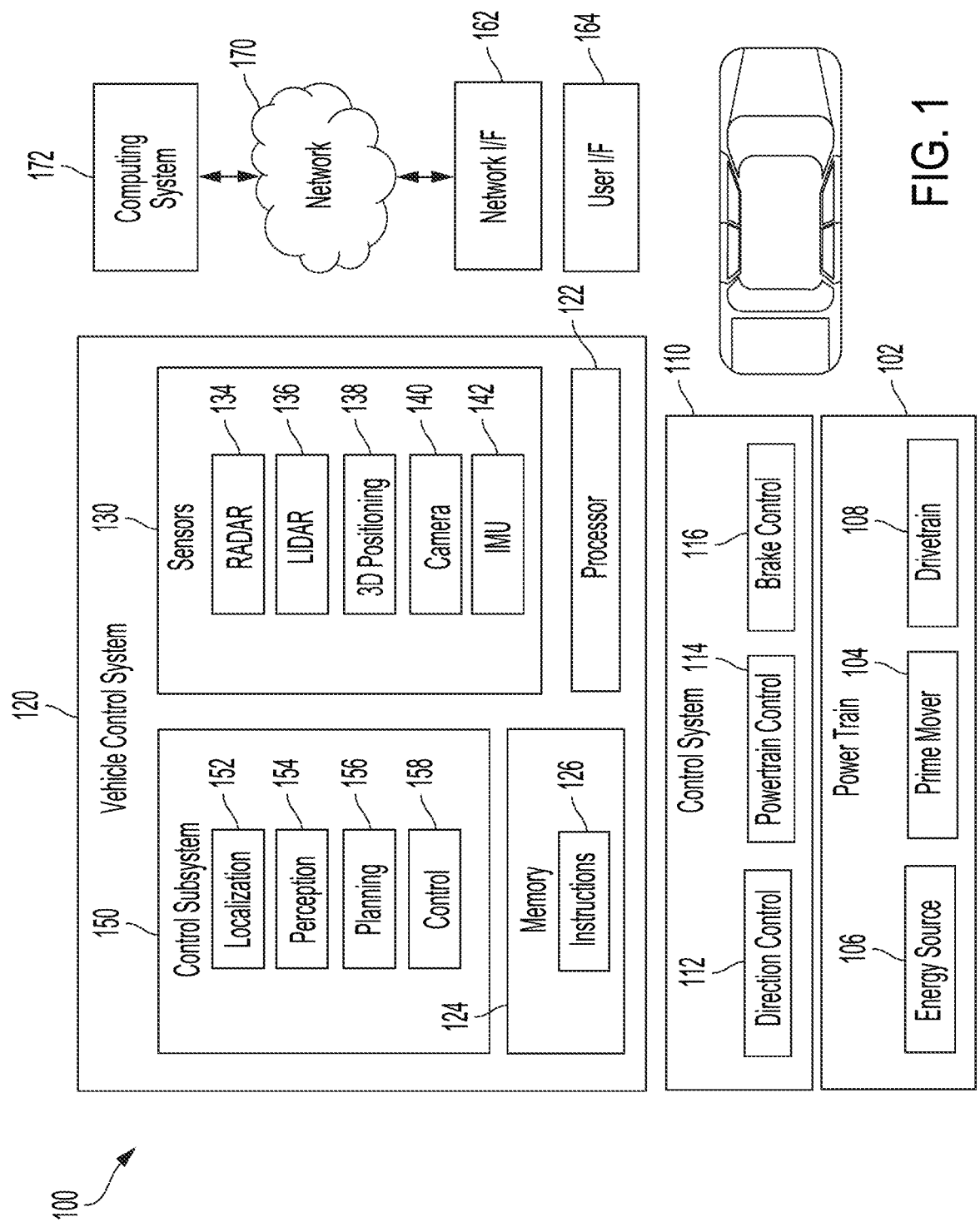
FIG. 1 is a block diagram of an example of a system environment for autonomous vehicles.

A LIDAR sensor system can generate and transmit a light beam that an object can reflect or otherwise scatter as a return beam corresponding to the transmitted beam. The LIDAR sensor system can receive the return beam, and process the return beam or characteristics thereof to determine parameters regarding the object such as range and velocity. The LIDAR sensor system can apply various frequency or phase modulations to the transmitted beam, which can facilitate relating the return beam to the transmitted beam in order to determine the parameters regarding the object.

Integrated circuit (IC) packages (or modules) integrating III-V semiconductor devices (or dies) that include GaAs, InP, or other optoelectronic, with silicon substrates (or silicon devices) can be used in vehicle LIDAR sensor systems to facilitate various optical and electronic data communication and signal processing operations. However, coupling of dissimilar materials, such as a III-V semiconductor material and silicon, may be affected by mismatch in one or more material property or feature between the dissimilar materials. One such material feature relevant to the coupling of III-V semiconductor materials with silicon is coefficient of thermal expansion (CTE). The mismatch in CTE (alternatively referred to as ΔCTE hereafter) between III-V semiconductor material and silicon can result in mechanical stress at a bonding interface in the presence of thermal stress, which can arise from heat generated by optical components of the LIDAR sensor systems, including under vehicle temperature conditions, a bonding process between the materials (the formation of a solder bonding layer, for example) and/or from a thermal cycle reliability test. In some examples, the temperature for forming a AuSn-based solder bonding layer can be more 300° C. and the thermal cycle reliability test (which can be used to test the devices described herein for operation in LIDAR sensor systems under vehicle operation conditions) may subject the coupled materials to a few hundreds to thousands of cyclic stress from −40° C. or lower to 85° C. or higher. Such mechanical stress may cause defects (e.g., cracks) forming in the solder bonding layer, defects forming in one or both of the semiconductor materials, and/or or delamination of the solder bonding layer from one or both of the semiconductor materials.

Systems and methods in accordance with the present disclosure can facilitate more robust coupling between materials in LIDAR sensor systems, including between silicon and III-V semiconductor materials. For example, the LIDAR sensor systems can include components to locally reduce the mismatch in CTE between the III-V semiconductor material substrate and the silicon substrate while meeting optical and signal processing performance targets. For example, an overall CTE of the silicon substrate can be increased by including an array of conductive through-silicon (or substrate)-vias (TSVs) in a particular portion of the silicon substrate in contact with the III-V semiconductor substrate. By adjusting configuration and composition of the array of TSVs embedded in the particular portion of the silicon substrate, the composite CTE of that portion of the silicon substrate can be tuned to more closely resemble that of the III-V semiconductor substrate, thereby reducing occurrence of mechanical stress at the bonding interface as well as mechanical stress within the III-V semiconductor substrate and the silicon substrate, respectively, which can improve the process yield and reliability of the final product.

1. System Environments for Autonomous Vehicles

FIG. 1 is a block diagram illustrating an example of a system environment for autonomous vehicles according to some implementations. FIG. 1 depicts an example autonomous vehicle 100 within which the various techniques disclosed herein may be implemented. The vehicle 100, for example, may include a powertrain 102 including a prime mover 104 powered by an energy source 106 and capable of providing power to a drivetrain 108, as well as a control system 110 including a direction control 112, a powertrain control 114, and a brake control 116. The vehicle 100 may be implemented as any number of different types of vehicles, including vehicles capable of transporting people and/or cargo, and capable of traveling in various environments. The aforementioned components 102-116 can vary widely based upon the type of vehicle within which these components are utilized, such as a wheeled land vehicle such as a car, van, truck, or bus. The prime mover 104 may include one or more electric motors and/or an internal combustion engine (among others). The energy source may include, for example, a fuel system (e.g., providing gasoline, diesel, hydrogen, etc.), a battery system, solar panels or other renewable energy source, and/or a fuel cell system. The drivetrain 108 can include wheels and/or tires along with a transmission and/or any other mechanical drive components to convert the output of the prime mover 104 into vehicular motion, as well as one or more brakes configured to controllably stop or slow the vehicle 100 and direction or steering components suitable for controlling the trajectory of the vehicle 100 (e.g., a rack and pinion steering linkage enabling one or more wheels of the vehicle 100 to pivot about a generally vertical axis to vary an angle of the rotational planes of the wheels relative to the longitudinal axis of the vehicle). In some implementations, combinations of powertrains and energy sources may be used (e.g., in the case of electric/gas hybrid vehicles), and in some instances multiple electric motors (e.g., dedicated to individual wheels or axles) may be used as a prime mover.

The direction control 112 may include one or more actuators and/or sensors for controlling and receiving feedback from the direction or steering components to enable the vehicle 100 to follow a desired trajectory. The powertrain control 114 may be configured to control the output of the powertrain 102, e.g., to control the output power of the prime mover 104, to control a gear of a transmission in the drivetrain 108, etc., thereby controlling a speed and/or direction of the vehicle 100. The brake control 116 may be configured to control one or more brakes that slow or stop vehicle 100, e.g., disk or drum brakes coupled to the wheels of the vehicle.

Other vehicle types, including but not limited to off-road vehicles, all-terrain or tracked vehicles, construction equipment, may utilize different powertrains, drivetrains, energy sources, direction controls, powertrain controls and brake controls. Moreover, in some implementations, some of the components can be combined, e.g., where directional control of a vehicle is primarily handled by varying an output of one or more prime movers.

Various levels of autonomous control over the vehicle 100 can be implemented in a vehicle control system 120, which may include one or more processors 122 and one or more memories 124, with each processor 122 configured to execute program code instructions 126 stored in a memory 124. The processors(s) can include, for example, graphics processing unit(s) ("GPU(s)")) and/or central processing unit(s) ("CPU(s)").

Sensors 130 may include various sensors suitable for collecting information from a vehicle's surrounding environment for use in controlling the operation of the vehicle. For example, sensors 130 can include radar sensor 134, LIDAR (Light Detection and Ranging) sensor 136, a 3D positioning sensors 138, e.g., any of an accelerometer, a gyroscope, a magnetometer, or a satellite navigation system such as GPS (Global Positioning System), GLONASS (Globalnaya Navigazionnaya Sputnikovaya Sistema, or Global Navigation Satellite System), BeiDou Navigation Satellite System (BDS), Galileo, Compass, etc. The 3D positioning sensors 138 can be used to determine the location of the vehicle on the Earth using satellite signals. The sensors 130 can include a camera 140 and/or an IMU (inertial measurement unit) 142. The camera 140 can be a monographic or stereographic camera and can record still and/or video images. The IMU 142 can include multiple gyroscopes and accelerometers capable of detecting linear and rotational motion of the vehicle in three directions. One or more encoders (not illustrated), such as wheel encoders may be used to monitor the rotation of one or more wheels of vehicle 100. Each sensor 130 can output sensor data at various data rates, which may be different than the data rates of other sensors 130.

The outputs of sensors 130 may be provided to a set of control subsystems 150, including a localization subsystem 152, a planning subsystem 156, a perception subsystem 154, and a control subsystem 158. The localization subsystem 152 can perform functions such as precisely determining the location and orientation (also sometimes referred to as "pose") of the vehicle 100 within its surrounding environment, and generally within some frame of reference. The location of an autonomous vehicle can be compared with the location of an additional vehicle in the same environment as part of generating labeled autonomous vehicle data. The perception subsystem 154 can perform functions such as detecting, tracking, determining, and/or identifying objects within the environment surrounding vehicle 100. A machine learning model in accordance with some implementations can be utilized in tracking objects. The planning subsystem 156 can perform functions such as planning a trajectory for vehicle 100 over some timeframe given a desired destination as well as the static and moving objects within the environment. A machine learning model in accordance with some implementations can be utilized in planning a vehicle trajectory. The control subsystem 158 can perform functions such as generating suitable control signals for controlling the various controls in the vehicle control system 120 in order to implement the planned trajectory of the vehicle 100. A machine learning model can be utilized to generate one or more signals to control an autonomous vehicle to implement the planned trajectory.

Multiple sensors of types illustrated in FIG. 1 can be used for redundancy and/or to cover different regions around a vehicle, and other types of sensors may be used. Various types and/or combinations of control subsystems may be used. Some or all of the functionality of a subsystem 152-158 may be implemented with program code instructions 126 resident in one or more memories 124 and executed by one or more processors 122, and these subsystems 152-158 may in some instances be implemented using the same processor(s) and/or memory. Subsystems may be implemented at least in part using various dedicated circuit logic, various processors, various field programmable gate arrays ("FPGA"), various application-specific integrated circuits ("ASIC"), various real time controllers, and the like, as noted above, multiple subsystems may utilize circuitry, processors, sensors, and/or other components. Further, the various components in the vehicle control system 120 may be networked in various manners.

In some implementations, the vehicle 100 may also include a secondary vehicle control system (not illustrated), which may be used as a redundant or backup control system for the vehicle 100. In some implementations, the secondary vehicle control system may be capable of fully operating the autonomous vehicle 100 in the event of an adverse event in the vehicle control system 120, while in other implementations, the secondary vehicle control system may only have limited functionality, e.g., to perform a controlled stop of the vehicle 100 in response to an adverse event detected in the primary vehicle control system 120. In still other implementations, the secondary vehicle control system may be omitted.

Various architectures, including various combinations of software, hardware, circuit logic, sensors, and networks, may be used to implement the various components illustrated in FIG. 1. Each processor may be implemented, for example, as a microprocessor and each memory may represent the random access memory ("RAM") devices comprising a main storage, as well as any supplemental levels of memory, e.g., cache memories, non-volatile or backup memories (e.g., programmable or flash memories), read-only memories, etc. In addition, each memory may be considered to include memory storage physically located elsewhere in the vehicle 100, e.g., any cache memory in a processor, as well as any storage capacity used as a virtual memory, e.g., as stored on a mass storage device or another computer controller. One or more processors illustrated in FIG. 1, or entirely separate processors, may be used to implement additional functionality in the vehicle 100 outside of the purposes of autonomous control, e.g., to control entertainment systems, to operate doors, lights, convenience features, etc.

In addition, for additional storage, the vehicle 100 may include one or more mass storage devices, e.g., a removable disk drive, a hard disk drive, a direct access storage device ("DASD"), an optical drive (e.g., a CD drive, a DVD drive, etc.), a solid state storage drive ("SSD"), network attached storage, a storage area network, and/or a tape drive, among others.

Furthermore, the vehicle 100 may include a user interface 164 to enable vehicle 100 to receive a number of inputs from and generate outputs for a user or operator, e.g., one or more displays, touchscreens, voice and/or gesture interfaces, buttons and other tactile controls, etc. Otherwise, user input may be received via another computer or electronic device, e.g., via an app on a mobile device or via a web interface.

Moreover, the vehicle 100 may include one or more network interfaces, e.g., network interface 162, suitable for communicating with one or more networks 170 (e.g., a Local Area Network ("LAN"), a wide area network ("WAN"), a wireless network, and/or the Internet, among others) to permit the communication of information with other computers and electronic device, including, for example, a central service, such as a cloud service, from which the vehicle 100 receives environmental and other data for use in autonomous control thereof. Data collected by the one or more sensors 130 can be uploaded to a computing system 172 via the network 170 for additional processing. In some implementations, a time stamp can be added to each instance of vehicle data prior to uploading.

Each processor illustrated in FIG. 1, as well as various additional controllers and subsystems disclosed herein, generally operates under the control of an operating system and executes or otherwise relies upon various computer software applications, components, programs, objects, modules, data structures, etc., as will be described in greater detail below. Moreover, various applications, components, programs, objects, modules, etc. may also execute on one or more processors in another computer coupled to vehicle 100 via network 170, e.g., in a distributed, cloud-based, or client-server computing environment, whereby the processing required to implement the functions of a computer program may be allocated to multiple computers and/or services over a network.

In general, the routines executed to implement the various implementations described herein, whether implemented as part of an operating system or a specific application, component, program, object, module or sequence of instructions, or even a subset thereof, will be referred to herein as "program code". Program code can include one or more instructions that are resident at various times in various memory and storage devices, and that, when read and executed by one or more processors, perform the steps necessary to execute steps or elements embodying the various aspects of the present disclosure. Moreover, while implementations have and hereinafter will be described in the context of fully functioning computers and systems, it will be appreciated that the various implementations described herein are capable of being distributed as a program product in a variety of forms, and that implementations can be implemented regardless of the particular type of computer readable media used to actually carry out the distribution.

Examples of computer readable media include tangible, non-transitory media such as volatile and non-volatile memory devices, floppy and other removable disks, solid state drives, hard disk drives, magnetic tape, and optical disks (e.g., CD-ROMs, DVDs, etc.) among others.

In addition, various program code described hereinafter may be identified based upon the application within which it is implemented in a specific implementation. Any particular program nomenclature that follows is used merely for convenience, and thus the present disclosure should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), the present disclosure is not limited to the specific organization and allocation of program functionality described herein.

2. LIDAR for Automotive Applications

Figure 5:
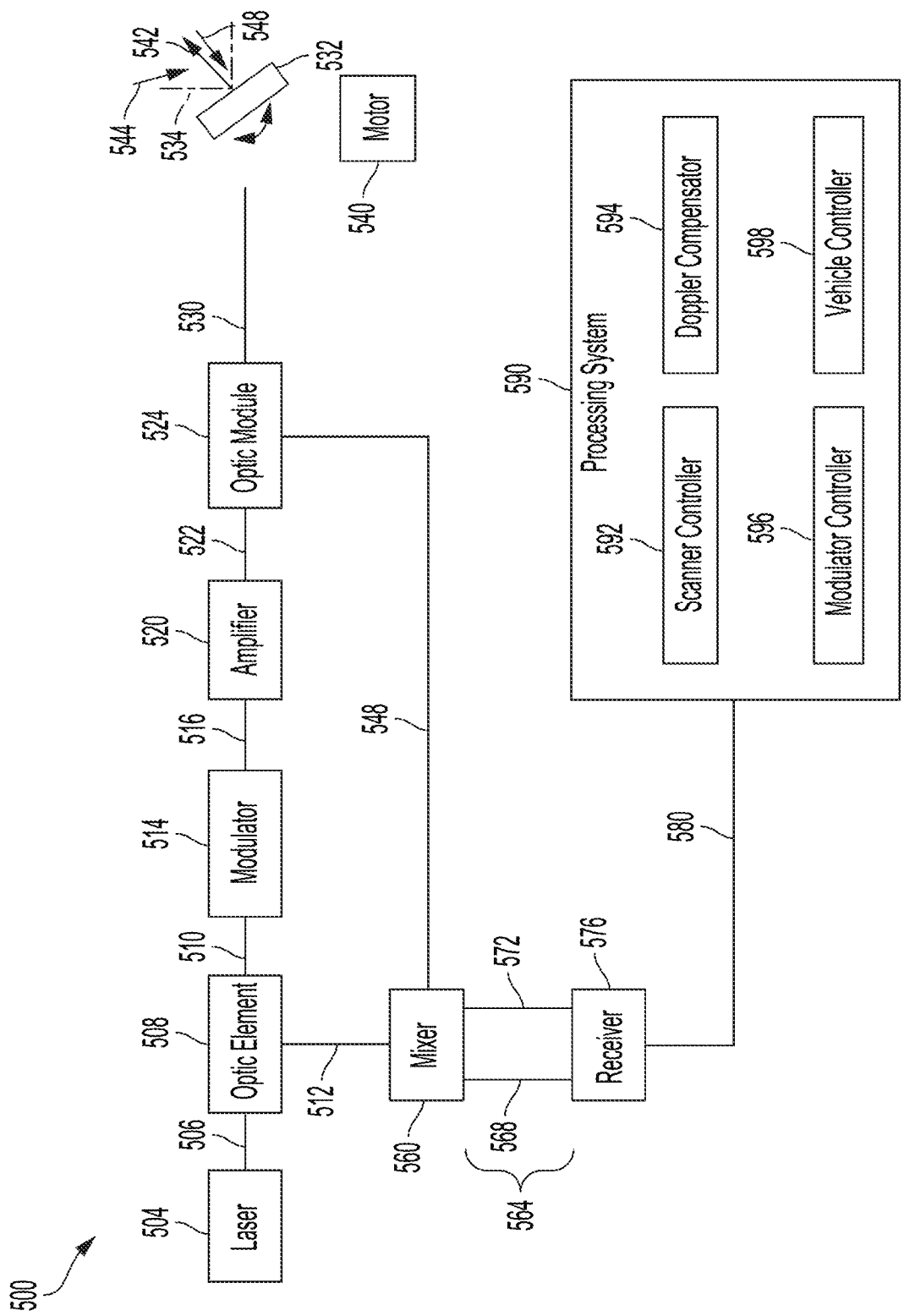
FIG. 5 is a block diagram of an example of a LIDAR sensor system.

A truck can include a LIDAR system (e.g., vehicle control system 120 in FIG. 1, LIDAR sensor system 500 in FIG. 5, among others described herein). In some implementations, the LIDAR sensor system 500 can use frequency modulation to encode an optical signal and scatter the encoded optical signal into free-space using optics. By detecting the frequency differences between the encoded optical signal and a returned signal reflected back from an object, the frequency modulated (FM) LIDAR sensor system can determine the location of the object and/or precisely measure the velocity of the object using the Doppler effect. In some implementations, an FM LIDAR sensor system may use a continuous wave (referred to as, "FMCW LIDAR") or a quasi-continuous wave (referred to as, "FMQW LIDAR"). In some implementations, the LIDAR sensor system can use phase modulation (PM) to encode an optical signal and scatters the encoded optical signal into free-space using optics.

In some instances, an object (e.g., a pedestrian wearing dark clothing) may have a low reflectivity, in that it only reflects back to the sensors (e.g., sensors 130 in FIG. 1) of the FM or PM LIDAR sensor system a low amount (e.g., 10% or less) of the light that hit the object. In other instances, an object (e.g., a shiny road sign) may have a high reflectivity (e.g., above 10%), in that it reflects back to the sensors of the FM LIDAR sensor system a high amount of the light that hit the object.

Regardless of the object's reflectivity, an FM LIDAR sensor system may be able to detect (e.g., classify, recognize, discover, etc.) the object at greater distances (e.g., $2x$) than a conventional LIDAR sensor system. For example, an FM LIDAR sensor system may detect a low reflectively object beyond 300 meters, and a high reflectivity object beyond 400 meters.

To achieve such improvements in detection capability, the FM LIDAR sensor system may use sensors (e.g., sensors 130 in FIG. 1). In some implementations, these sensors can be single photon sensitive, meaning that they can detect the smallest amount of light possible. While an FM LIDAR sensor system may, in some applications, use infrared wavelengths (e.g., 950 nm, 1550 nm, etc.), it is not limited to the infrared wavelength range (e.g., near infrared: 800 nm-1500 nm; middle infrared: 1500 nm-5600 nm; and far infrared: 5600 nm-1,000,000 nm). By operating the FM or PM LIDAR sensor system in infrared wavelengths, the FM or PM LIDAR sensor system can broadcast stronger light pulses or light beams than conventional LIDAR sensor systems.

Thus, by detecting an object at greater distances, an FM LIDAR sensor system may have more time to react to unexpected obstacles. Indeed, even a few milliseconds of extra time could improve response time and comfort, especially with heavy vehicles (e.g., commercial trucking vehicles) that are driving at highway speeds.

The FM LIDAR sensor system can provide accurate velocity for each data point instantaneously. In some implementations, a velocity measurement is accomplished using the Doppler effect which shifts frequency of the light received from the object based at least one of the velocity in the radial direction (e.g., the direction vector between the object detected and the sensor) or the frequency of the laser signal. For example, for velocities encountered in on-road situations where the velocity is less than 100 meters per second (m/s), this shift at a wavelength of 1550 nanometers (nm) amounts to the frequency shift that is less than 130 megahertz (MHz). This frequency shift is small such that it is difficult to detect directly in the optical domain. However, by using coherent detection in FMCW, PMCW, or FMQW LIDAR sensor systems, the signal can be converted to the RF domain such that the frequency shift can be calculated using various signal processing techniques. This enables the autonomous vehicle control system to process incoming data faster.

Instantaneous velocity calculation also makes it easier for the FM LIDAR sensor system to determine distant or sparse data points as objects and/or track how those objects are moving over time. For example, an FM LIDAR sensor (e.g., sensors 130 in FIG. 1) may only receive a few returns (e.g., hits) on an object that is 300 m away, but if those return give a velocity value of interest (e.g., moving towards the vehicle at >70 mph), then the FM LIDAR sensor system and/or the autonomous vehicle control system may determine respective weights to probabilities associated with the objects.

Faster identification and/or tracking of the FM LIDAR sensor system gives an autonomous vehicle control system more time to maneuver a vehicle. A better understanding of how fast objects are moving also allows the autonomous vehicle control system to plan a better reaction.

The FM LIDAR sensor system can have less static compared to conventional LIDAR sensor systems. That is, the conventional LIDAR sensor systems that are designed to be more light-sensitive typically perform poorly in bright sunlight. These systems also tend to suffer from crosstalk (e.g., when sensors get confused by each other's light pulses or light beams) and from self-interference (e.g., when a sensor gets confused by its own previous light pulse or light beam). To overcome these disadvantages, vehicles using the conventional LIDAR sensor systems often need extra hardware, complex software, and/or more computational power to manage this "noise."

In contrast, FM LIDAR sensor systems do not suffer from these types of issues because each sensor is specially designed to respond only to its own light characteristics (e.g., light beams, light waves, light pulses). If the returning light does not match the timing, frequency, and/or wavelength of what was originally transmitted, then the FM sensor can filter (e.g., remove, ignore, etc.) out that data point. As such, FM LIDAR sensor systems produce (e.g., generates, derives, etc.) more accurate data with less hardware or software requirements, enabling smoother driving.

The FM LIDAR sensor system can be easier to scale than conventional LIDAR sensor systems. As more self-driving vehicles (e.g., cars, commercial trucks, etc.) show up on the road, those powered by an FM LIDAR sensor system likely will not have to contend with interference issues from sensor crosstalk. Furthermore, an FM LIDAR sensor system uses less optical peak power than conventional LIDAR sensors. As such, some or all of the optical components for an FM LIDAR can be produced on a single chip, which produces its own benefits, as discussed herein.

2.1 Commercial Trucking

Figure 2:
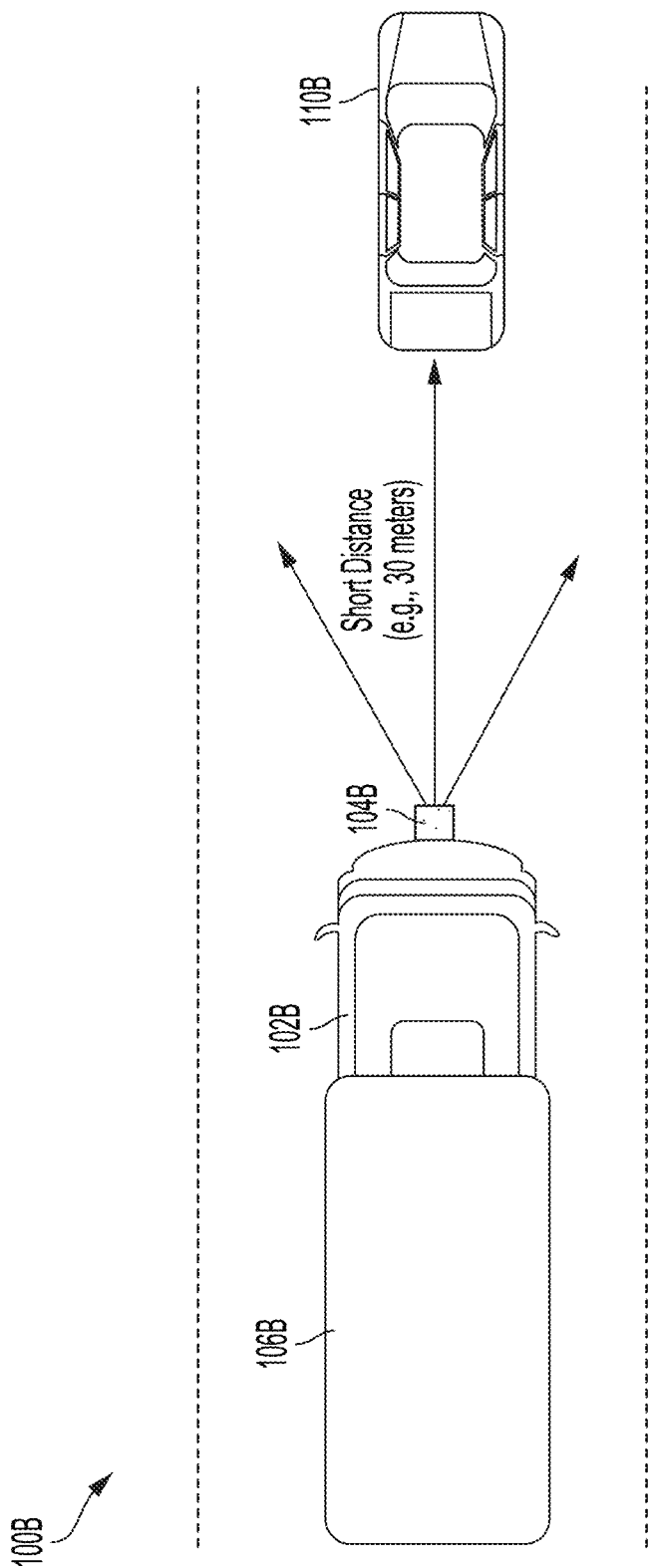
FIG. 2 is a block diagram of an example of a system environment for autonomous commercial trucking vehicles.

FIG. 2 is a block diagram illustrating an example of a system environment for autonomous commercial trucking vehicles, according to some implementations. The environment 100B includes a commercial truck 102B for hauling cargo 106B. In some implementations, the commercial truck 102B may include vehicles configured to long-haul freight transport, regional freight transport, intermodal freight transport (i.e., in which a road-based vehicle is used as one of multiple modes of transportation to move freight), and/or any other road-based freight transport applications. In some implementations, the commercial truck 102B may be a flatbed truck, a refrigerated truck (e.g., a reefer truck), a vented van (e.g., dry van), a moving truck, etc. In some implementations, the cargo 106B may be goods and/or produce. In some implementations, the commercial truck 102B may include a trailer to carry the cargo 106B, such as a flatbed trailer, a lowboy trailer, a step deck trailer, an extendable flatbed trailer, a sidekit trailer, etc.

The environment 100B includes an object 110B (shown in FIG. 2 as another vehicle) that is within a distance range that is equal to or less than 30 meters from the truck.

The commercial truck 102B may include a LIDAR sensor system 104B (e.g., an FM LIDAR sensor system, vehicle control system 120 in FIG. 1, LIDAR sensor system 500 in FIG. 5) for determining a distance to the object 110B and/or measuring the velocity of the object 110B. Although FIG. 2 shows that one LIDAR sensor system 104B is mounted on the front of the commercial truck 102n, the number of LIDAR sensor system and the mounting area of the LIDAR sensor system on the commercial truck are not limited to a particular number or a particular area. The commercial truck 102B may include any number of LIDAR sensor systems 104B (or components thereof, such as sensors, modulators, coherent signal generators, etc.) that are mounted onto any area (e.g., front, back, side, top, bottom, underneath, and/or bottom) of the commercial truck 102B to facilitate the detection of an object in any free-space relative to the commercial truck 102B.

As shown, the LIDAR sensor system 104B in environment 100B may be configured to detect an object (e.g., another vehicle, a bicycle, a tree, street signs, potholes, etc.) at short distances (e.g., 30 meters or less) from the commercial truck 102B.

Figure 3:
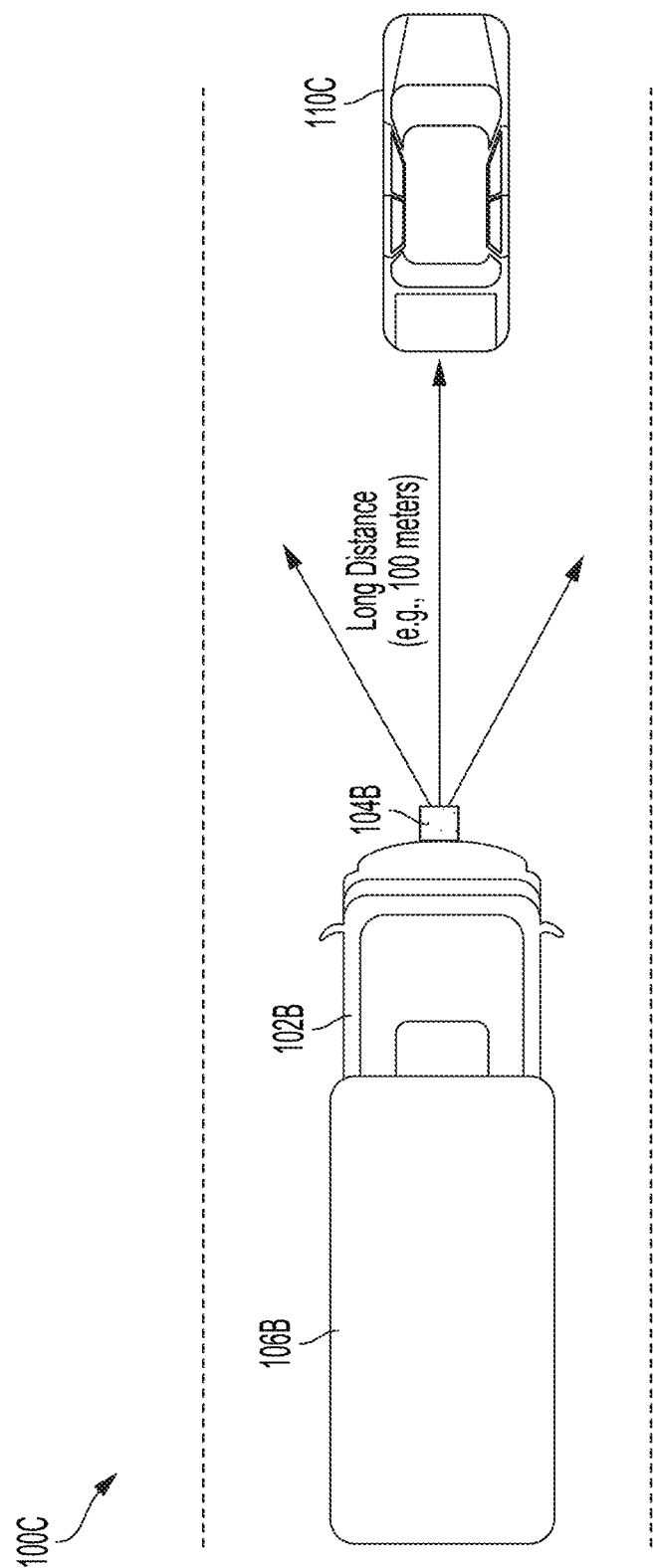
FIG. 3 is a block diagram of an example of a system environment for autonomous commercial trucking vehicles.

FIG. 3 is a block diagram illustrating an example of a system environment for autonomous commercial trucking vehicles, according to some implementations. The environment 100C includes the same components (e.g., commercial truck 102B, cargo 106B, LIDAR sensor system 104B, etc.) that are included in environment 100B.

The environment 100C includes an object 110C (shown in FIG. 3 as another vehicle) that is within a distance range that is (i) more than 30 meters and (ii) equal to or less than 150 meters from the commercial truck 102B. As shown, the LIDAR sensor system 104B in environment 100C may be configured to detect an object (e.g., another vehicle, a bicycle, a tree, street signs, potholes, etc.) at a distance (e.g., 100 meters) from the commercial truck 102B.

Figure 4:
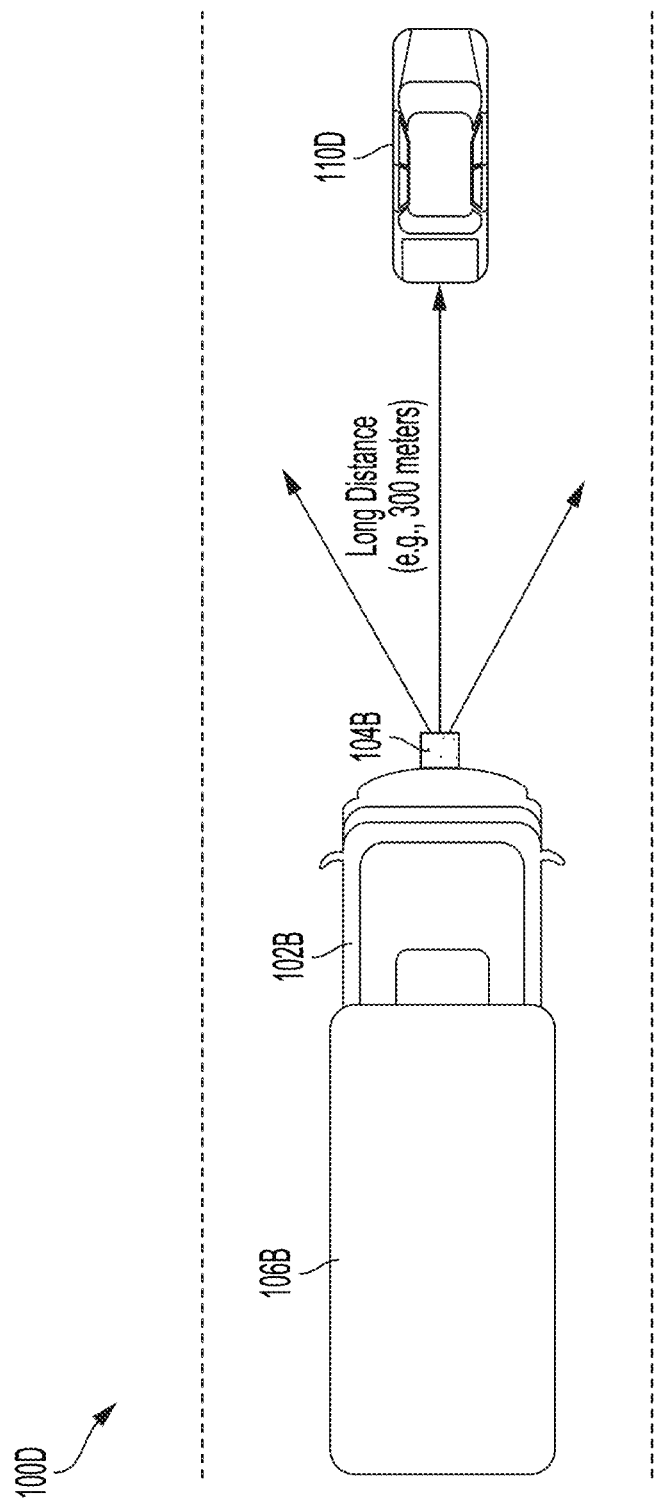
FIG. 4 is a block diagram of an example of a system environment for autonomous commercial trucking vehicles.

FIG. 4 is a block diagram illustrating an example of a system environment for autonomous commercial trucking vehicles, according to some implementations. The environment 100D includes the same components (e.g., commercial truck 102B, cargo 106B, LIDAR sensor system 104B, etc.) that are included in environment 100B.

The environment 100D includes an object 110D (shown in FIG. 4 as another vehicle) that is within a distance range that is more than 150 meters from the commercial truck 102B. As shown, the LIDAR sensor system 104B in environment 100D may be configured to detect an object (e.g., another vehicle, a bicycle, a tree, street signs, potholes, etc.) at a distance (e.g., 300 meters) from the commercial truck 102B.

In commercial trucking applications, it is important to effectively detect objects at all ranges due to the increased weight and, accordingly, longer stopping distance required for such vehicles. FM LIDAR sensor systems (e.g., FMCW and/or FMQW systems) or PM LIDAR sensor systems are well-suited for commercial trucking applications due to the advantages described above. As a result, commercial trucks equipped with such systems may have an enhanced ability to move both people and goods across short or long distances. In various implementations, such FM or PM LIDAR sensor systems can be used in semi-autonomous applications, in which the commercial truck has a driver and some functions of the commercial truck are autonomously operated using the FM or PM LIDAR sensor system, or fully autonomous applications, in which the commercial truck is operated entirely by the FM or LIDAR sensor system, alone or in combination with other vehicle systems.

3. LIDAR Sensor Systems

FIG. 5 depicts an example of a LIDAR sensor system 500. The LIDAR sensor system 500 can be used to determine parameters regarding objects, such as range and velocity, and output the parameters to a remote system. For example, the LIDAR sensor system 500 can output the parameters for use by a vehicle controller that can control operation of a vehicle responsive to the received parameters (e.g., vehicle controller 598) or a display that can present a representation of the parameters. The LIDAR sensor system 500 can be a coherent detection system. The LIDAR sensor system 500 can be used to implement various features and components of the systems described with reference to FIGS. 1-4. The LIDAR sensor system 500 can include components for performing various detection approaches, such as to be operated as an amplitude modular LIDAR system or a coherent LIDAR system. The LIDAR sensor system 500 can be used to perform time of flight range determination. In some implementations, various components or combinations of components of the LIDAR sensor system 500, such as laser source 504 and modulator 514, can be in a same housing, provided in a same circuit board or other electronic component, or otherwise integrated. In some implementations, various components or combinations of components of the LIDAR sensor system 500 can be provided as separate components, such as by using optical couplings (e.g., optical fibers) for components that generate and/or receive optical signals, such as light beams, or wired or wireless electronic connections for components that generate and/or receive electrical (e.g., data) signals. Various components of the LIDAR sensor system 500 can be arranged with respect to one another such that light (e.g., beams of light) between the components is directed through free space, such as a space provided by an air (or vacuum) gap, a space that is not through an optical fiber, a space that is free of structural components around a path along which the light is directed (e.g., an empty space at least on the order of millimeters away from a direct line path between the components; an empty space of a size greater than an expected beam width of the light, such as where the light is a collimated beam), or various combinations thereof.

In some implementations, a semiconductor substrate and/or semiconductor package include one or more components of at least one of a transmission (Tx) path or a receiving (Rx) path of the LIDAR sensor system 500. This can include, for example, optical and/or electronic components that can generate heat that may be transferred into the semiconductor substrate and/or semiconductor package during operation. In some implementations, the semiconductor substrate and/or semiconductor package include at least one of silicon photonics circuitry, planar lightwave circuitry (PLC), or III-V semiconductor circuitry.

In some implementations, the optical and/or electronic components formed on or coupled to the semiconductor substrate and/or semiconductor package to perform a plurality of functions in the LIDAR sensor system 500 are collectively referred to as a circuit module. In some implementations, the circuit module includes III-V semiconductor circuitry coupled to at least one of silicon photonics circuitry or PLC. In the present disclosure, "coupling" may refer to a physical connection, an electrical connection, or both, between two components.

In some implementations, a first semiconductor substrate and/or a first semiconductor package include the Tx path and a second semiconductor substrate and/or a second semiconductor package may include the Rx path. In some arrangements, the Rx input/output ports and/or the Tx input/output ports may occur (or be formed/disposed/located/placed) along one or more edges of one or more semiconductor substrates and/or semiconductor packages.

In some implementations, the circuit module includes at least one of silicon photonics circuitry, PLC, or III-V semiconductor circuitry in which all of its components (e.g., optical paths, optical amplifiers, phase modulators, etc.) are formed on, disposed on or otherwise coupled to a single substrate. In some implementations, all of the components of the circuit module are formed on, disposed over, or otherwise coupled to a single layer to form a horizontal structure of an integrated circuit. In some implementations, components of the circuit module are formed on, disposed over, or otherwise coupled to multiple layers stacked on a single substrate to form a vertical structure of an integrated circuit. For example, the circuit module may include phase modulators implemented as one or more PLC modules, optical paths implemented as silicon photonics circuitry, and SOAs implemented as III-V modules, all of which are formed on, disposed over, or otherwise coupled to a single III-V substrate. The III-V semiconductor materials may include at least one of gallium arsenide (GaAs), indium phosphide (InP), indium arsenide (InAs), or combinations thereof.

The LIDAR sensor system 500 can include a laser source 504 that generates and emits a beam 506, such as a carrier wave light beam. An optic element 508 can split the beam 506 into a beam 510 and a reference beam 512 (e.g., reference signal). In some implementations, any suitable optical, electronic, or optoelectronic elements are used to provide the beam 510 and the reference beam 512 from the laser source 504 to other elements. For example, the optic element 508 can be a splitter or a circulator.

A modulator 514 can modulate one or more properties of the input beam 510 to generate a beam 516 (e.g., target beam). In some implementations, the modulator 514 can modulate a frequency of the input beam 510 (e.g., optical frequency corresponding to optical wavelength, where $c = \lambda v$, where c is the speed of light, $\lambda$ is the wavelength, and v is the frequency). For example, the modulator 514 can modulate a frequency of the input beam 510 linearly such that a frequency of the beam 516 increases or decreases linearly over time. As another example, the modulator 514 can modulate a frequency of the input beam 510 non-linearly (e.g., exponentially). In some implementations, the modulator 514 can modulate a phase of the input beam 510 to generate the beam 516. However, the modulation techniques are not limited to the frequency modulation and the phase modulation. Any suitable modulation techniques can be used to modulate one or more properties of a beam. Returning to FIG. 5, the modulator 514 can modulate the beam 510 subsequent to splitting of the beam 506 by the optic element 508, such that the reference beam 512 is unmodulated, or the modulator 514 can modulate the beam 506 and provide a modulated beam to the optic element 508 for the optic element 508 to split into a target beam and a reference beam. In some implementations, the modulator 514 includes a circuit module having at least one of silicon photonics circuitry, PLC, or III-V semiconductor circuitry.

The beam 516, which is used for outputting a transmitted signal, can have most of the energy of the beam 506 outputted by the laser source 504, while the reference beam 512 can have significantly less energy, yet sufficient energy to enable mixing with a return beam 548 (e.g., returned light) scattered from an object. The reference beam 512 can be used as a local oscillator (LO) signal. The reference beam 512 passes through a reference path and can be provided to a mixer 560. An amplifier 520 can amplify the beam 516 to output a beam 522.

The LIDAR sensor system 500 can include an optic module 524, which can receive the beam 522. The optic module 524 can be a free space optic. For example, the optic module 524 can include one or more optics (e.g., lenses, mirrors, waveguides, grating couplers, prisms, waveplates) arranged to have a gap (e.g., air gap) between the one or more optics, allowing for free space transmission of light (e.g., rather than all light being coupled between optics by fibers). The optic module 524 can perform functions such as collimating, filtering, and/or polarizing the beam 522 to output a beam 530 to optics 532 (e.g., scanning optics).

Figure 6:
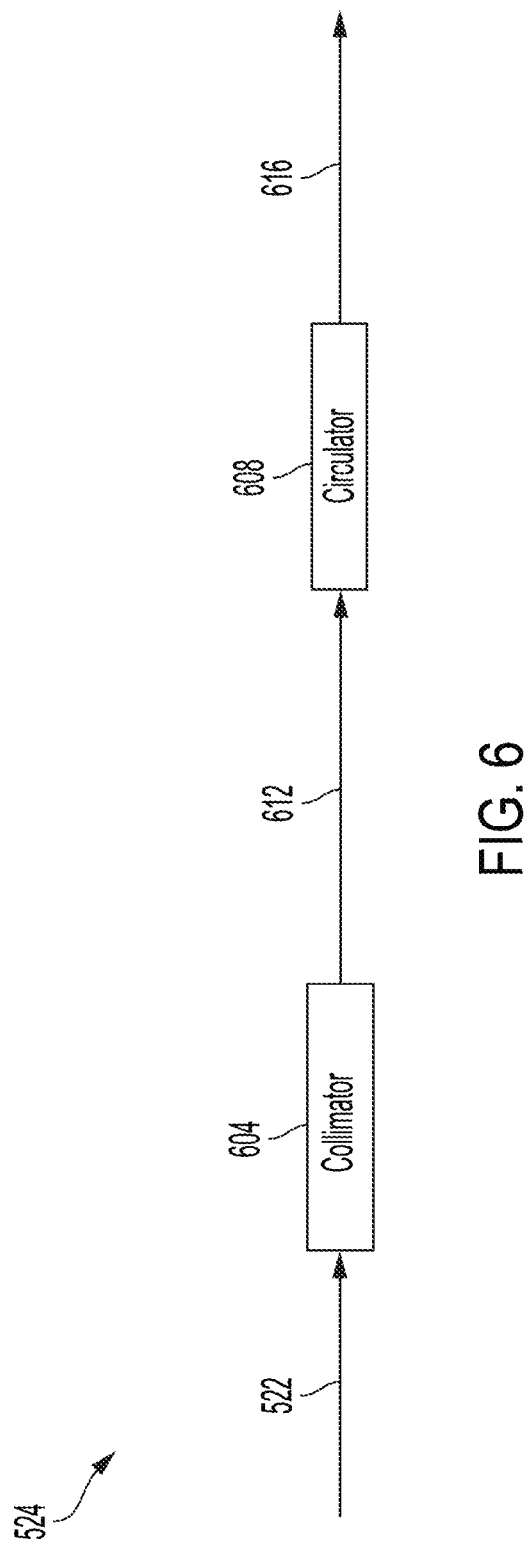
FIG. 6 is a block diagram of an example of an optic module of a LIDAR sensor system.

Referring to FIG. 6, the optic module 524 can include at least one collimator 604 and at least one circulator 608. For example, the circulator 608 can be between the collimator 604 and the optics 532 of FIG. 5. The circulator 608 can receive a collimated beam 612 outputted by the collimator 604 and output a beam 616 (e.g., the beam 530 depicted in FIG. 5) to the optics 532. In some implementations, the circulator 608 can be between the laser source 504 and the collimator 604. At least one of the collimator 604 or the circulator 608 can be free space optics (and can be coupled with one another in free space), such as by being optically coupled via air gaps rather than optical fibers.

Referring further to FIG. 5, the optic module 524 can receive return beam 548 from the optics 532 and provide the return beam 548 to the mixer 560. The optics 532 can be scanning optics, such as one or more steering mirrors or polygon reflectors or deflectors to adjust the angle of received beams relative to outputted beams based on the orientation of outer surfaces (e.g., facets) of the optics relative to the received beam, or solid-state components (e.g., phased arrays, electro-optic crystals) configured to modify the direction of received light.

The optics 532 can define a field of view 544 that corresponds to angles scanned (e.g., swept) by the beam 542 (e.g., a transmitted beam). For example, the beam 542 can be scanned in the particular plane, such as an azimuth plane or elevation plane (e.g., relative to an object to which the LIDAR sensor system 500 is coupled, such as an autonomous vehicle). The optics 532 can be oriented so that the field of view 544 sweeps an azimuthal plane relative to the optics 532.

At least one motor 540 can be coupled with the optics 532 to control at least one of a position or an orientation of the optics 532 relative to the beam 530. For example, where the optics 532 include a mirror, reflector, or deflector, the motor 540 can rotate the optics 532 relative to an axis 534 (e.g., an axis orthogonal to the frame of reference depicted in FIG. 5) so that surfaces of the optics 532 at which the beam 530 is received vary in angle or orientation relative to the beam 530, causing the beam 542 to be varied in angle or direction as the beam 542 is outputted from the optics 532.

The beam 542 can be outputted from the optics 532 and reflected or otherwise scattered by an object (not shown) as a return beam 548 (e.g., return signal). The return beam 548 can be received on a reception path, which can include the circulator 608, and provided to the mixer 560.

The mixer 560 can be an optical hybrid, such as a 90 degree optical hybrid. The mixer 560 can receive the reference beam 512 and the return beam 548, and mix the reference beam 512 and the return beam 548 to output a signal 564 responsive to the reference beam 512 and the return beam 548. The signal 564 can include an in-phase (I) component 568 and a quadrature (Q) component 572.

The LIDAR sensor system 500 can include a receiver 576 that receives the signal 564 from the mixer 560. The receiver 576 can generate a signal 580 responsive to the signal 564, which can be an electronic (e.g., radio frequency) signal. The receiver 576 can include one or more photodetectors that output the signal 580 responsive to the signal 564.

The LIDAR sensor system 500 can include a processing system 590, which can be implemented using features of the vehicle control system 120 described with reference to FIG. 1. The processing system 590 can process data received regarding the return beam 548, such as the signal 580, to determine parameters regarding the object such as range and velocity. The processing system 590 can include a scanner controller 592 that can provide scanning signals to control operation of the optics 532, such as to control the motor 540 to cause the motor 540 to rotate the optics 532 to achieve a target scan pattern, such as a sawtooth scan pattern or step function scan pattern. The processing system 590 can include a Doppler compensator 594 that can determine the sign and size of a Doppler shift associated with processing the return beam 548 and a corrected range based thereon along with any other corrections. The processing system 590 can include a modulator controller 596 that can send one or more electrical signals to drive the modulator 514.

The processing system 590 can include or be communicatively coupled with a vehicle controller 598 to control operation of a vehicle for which the LIDAR sensor system 500 is installed (e.g., to provide complete or semi-autonomous control of the vehicle). For example, the vehicle controller 598 can be implemented by at least one of the LIDAR sensor system 500 or control circuitry of the vehicle. The vehicle controller 598 can control operation of the vehicle responsive to at least one of a range to the object or a velocity of the object determined by the processing system 590. For example, the vehicle controller 598 can transmit a control signal to at least one of a steering system or a braking system of the vehicle to control at least one of speed or direction of the vehicle.

4. LIDAR Sensor Systems Including Integrated Semiconductor Devices and Methods of Manufacturing LIDAR sensor systems in accordance with the present disclosure can have chips that include III-V semiconductor materials, which can allow for high-performance silicon photonics operations to be performed under vehicle operation conditions. For example, a CTE of a silicon substrate can be increased by including an array of conductive TSVs in a particular portion of the silicon substrate in contact with or corresponding to a III-V semiconductor die coupled to the silicon substrate. By adjusting configuration and composition of the array of TSVs embedded in the particular portion of the silicon substrate, the composite CTE of that portion of the silicon substrate can be tuned to more closely resemble that of the III-V semiconductor die, thereby reducing occurrence of mechanical defects at a bonding interface between the III-V die and the silicon substrate and improving the overall product yield and reliability.

Figure 7:
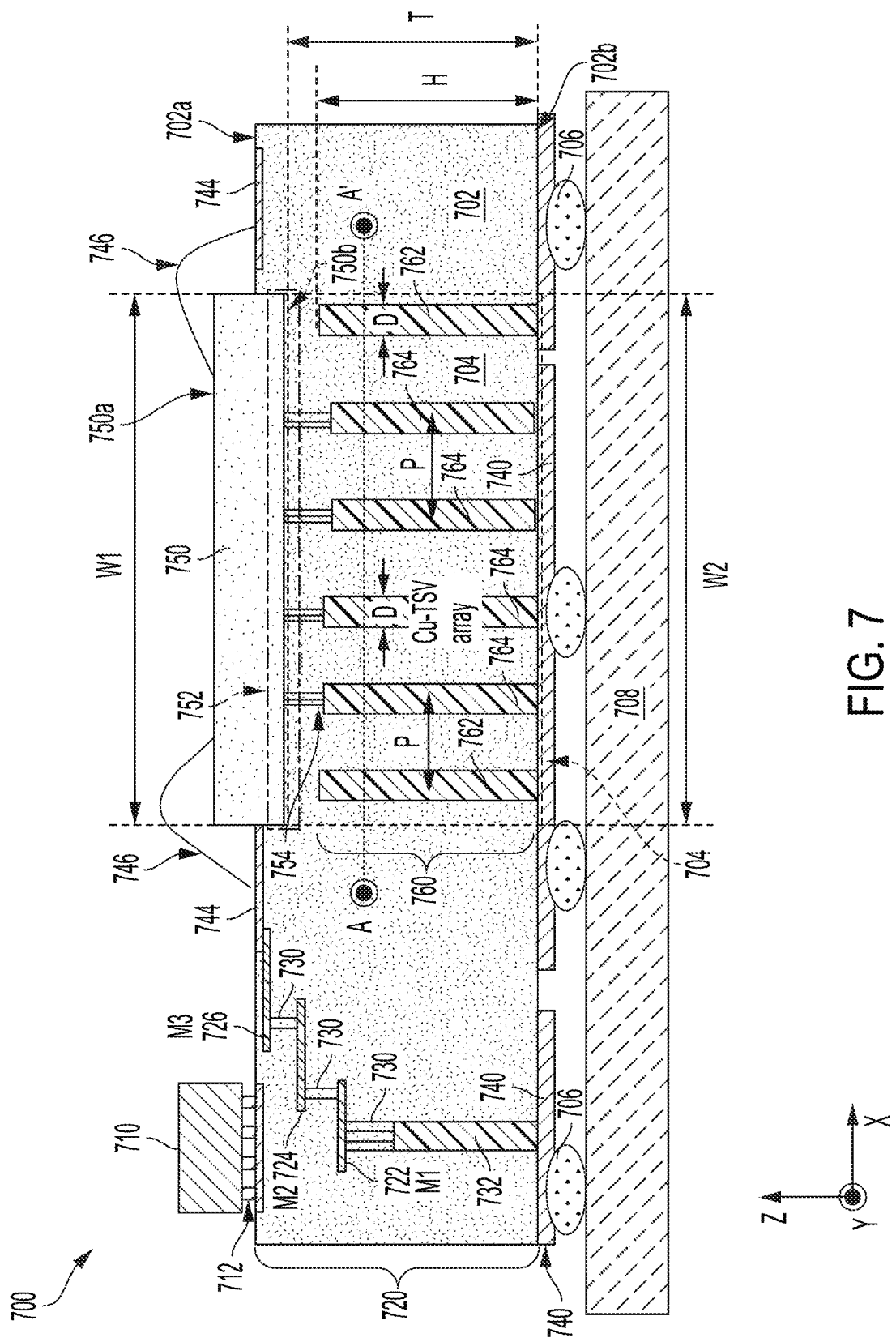
FIG. 7 is a schematic cross-sectional view of an example of a circuit module, in portion or in entirety, of a LIDAR sensor system.

FIG. 7 depicts an example of a circuit module 700 configured to perform a plurality of functions in the LIDAR sensor system 500. The circuit module 700 can include at least one of silicon photonics circuitry, PLC, or III-V semiconductor circuitry. In some implementations, the circuit module 700 can include a III-V semiconductor circuitry on a III-V semiconductor substrate (e.g., a III-V substrate) coupled to at least one of silicon photonics circuitry or PLC.

For example, still referring to FIG. 7, the circuit module 700 can include at least one integrated circuit (IC) substrate (e.g., an IC die or an IC chip) 710 and at least one III-V substrate (e.g., a III-V chip or a III-V die) 750 coupled to a semiconductor substrate 702.

In some implementations, the semiconductor substrate 702 is coupled to a substrate 708 using one or more conductive connectors 706. The substrate 708 can include additional active devices (e.g., transistors, diodes, etc.) and/or passive devices (e.g., resistors, capacitors, etc.). Examples of the conductive connectors 706 include microbumps, solder bumps, a hybrid bonding structure, or combinations thereof. In this regard, the circuit module 700 can be considered a package, such as an integrated circuit package, having a plurality of devices (e.g., chips or dies) coupled together and packaged using one or more insulating components. As depicted in FIG. 7, the IC substrate 710 and the III-V substrate 750 can be coupled to a first side (e.g., front side) 702a of the semiconductor substrate 702 and the substrate 708 can be coupled to a second side (e.g., back side) 702b of the semiconductor substrate 702. Optical devices, such as the laser 504 or other components of the LIDAR sensor system 500, can be formed from, disposed over, or otherwise coupled to the III-V substrate 750 or a portion thereof. Various such optical devices can generate heat during operation, which transfers into the III-V substrate 750 and semiconductor substrate 702 and thus can cause expansion of the III-V substrate 750 and semiconductor substrate 702.

The IC substrate 710 can include any active components configured to perform functions of at least one of silicon photonics circuitry or PLC. In some implementations, the IC substrate 710 can include a silicon substrate or a III-V semiconductor substrate. In some implementations, the III-V substrate 750 can include a III-V semiconductor substrate including, for example, GaAs, InAs, InP, other suitable III-V semiconductor materials, or combinations thereof.

The semiconductor substrate 702 can include any suitable semiconductor material, such as silicon. In some implementations, the semiconductor substrate 702 can consist of silicon, such that a bulk property (e.g., coefficient of thermal expansion, or CTE) of the semiconductor substrate 702 can be characterized or approximated based on that of silicon. In this regard, the semiconductor substrate 702 can be referred to as a silicon substrate 702. In some implementations, the semiconductor substrate 702 can include trace amount (e.g., less than about 3% by weight) of impurities, so long as the impurities do not substantially affect the bulk property of the semiconductor substrate 702.

In some implementations, the semiconductor substrate 702 has a composition different from that of the III-V substrate 750. For example, the semiconductor substrate 702 is free, or substantially free, of any III-V semiconductor materials, such as GaAs, InAs, and InP. In an example implementation, the semiconductor substrate 702 includes silicon and the III-V substrate 750 includes GaAs. In another example implementation, the semiconductor substrate 702 includes silicon and the III-V substrate 750 includes InP. In yet another example implementation, the semiconductor substrate 702 includes silicon and the III-V substrate 750 includes InAs.

The IC substrate 710 can be coupled to the semiconductor substrate 702 using a plurality of conductive connectors 712, which can be similar to the conductive connectors 706 described above. The III-V substrate 750 can be coupled to the semiconductor substrate 702 at a bonding interface 752. In some implementations, referring to FIG. 8, which depicts a portion of the circuit module 700 including the bonding interface 752, a first side (e.g., a back side) 750b of the III-V substrate 750 is coupled to the semiconductor substrate 702 by a solder bonding layer 770. The solder bonding layer 770 can include any suitable material, such as a gold (Au), silver (Ag), gold-tin (AuSn) alloy, or combinations thereof. In some implementations, referring to FIG. 9, the first side 750b of the III-V substrate 750, which is opposite to a second side (e.g., a front side) 750a, is directly bonded to the semiconductor substrate 702 at the bonding interface 752, i.e., the coupling between the III-V substrate 750 and the semiconductor substrate 702 does not include a solder bonding layer. In this regard, the III-V substrate 750 can be epitaxially grown onto a surface (i.e., the first side 702a) of the semiconductor substrate 702.

Referring back to FIG. 7, the IC substrate 710 can be coupled to the substrate 708 by a multi-layer interconnect (MLI) structure 720 formed in the semiconductor substrate 702 between the first side 702a and the second side 702b. The MLI structure 720 can include horizontal interconnect structures that extend laterally along the X-axis and/or the Y-axis and vertical interconnect structures that extend along the Z-axis (e.g., in the frame of reference of FIG. 7 in which the X and Z axes lie in the plane of FIG. 7). For example, the horizontal interconnect structures can include a plurality of metal layers, such as a metal layer (M1) 722, a metal layer (M2) 724, and a metal layer (M3) 726. In addition, the MLI structure 720 can include a metal layer 744 formed or disposed on the front side of the semiconductor substrate 702 to laterally couple portions of the MLI structure 720 with the III-V substrate 750.

The vertical interconnect structures can include a plurality of vias 730 and at least one TSV 732. In some implementations, the vias 730 can be coupled to interconnect structures along the Z-axis, e.g., coupling the metal layers 722-726 to one another or coupling one of the metal layers 722-726 to the TSV 732. In this regard, the vias 730 can partially extend through the semiconductor substrate 702 and therefore not directly contact any component formed or disposed on the back side of the semiconductor substrate 702. The TSV 732, on the other hand, can extend through the semiconductor substrate 702 to directly contact or couple with a redistribution structure 740 formed or disposed on the back side of the semiconductor substrate 702. The redistribution structure 740 can include interconnect structures that extend along the X-axis and/or the Y-axis to laterally couple to other components.

In some implementations, components of the MLI structure 720 (e.g., the metal layers 722-726 and 744, the vias 730, and the TSV 732) each include a conductive layer. The conductive layer can include any suitable conductive material, such as tungsten (W), copper (Cu), ruthenium (Ru), aluminum (Al), titanium nitride (TiN), tantalum nitride (TaN), other suitable conductive materials, or combinations thereof. Components of the MLI structure 720 can be formed by patterning the semiconductor substrate 702 to form an opening, depositing a conductive material in the opening, and optionally planarizing and/or etching back portions of the semiconductor substrate 702. The patterning process can include a series of lithography and etching processes. The conductive material can be deposited by a suitable process, such as chemical vapor deposition (CVD), physical vapor deposition (PVD), atomic layer deposition (ALD), plating, and/or other processes. The depicted configuration of the MLI structure 720 is for illustration purposes only and can include any suitable number of metal layers, vias, and TSVs according to specific design requirements.

The circuit module 700 can include a wire bond 746 that couples a front side of the III-V substrate 750 to the MLI structure 720. In some implementations, only end portions of the wire bond 746 contact the III-V substrate 750 and the MLI structure 720, respectively (i.e., a length of the wire bond 746 between each end of the wire bond 746 does not contact either the III-V substrate 750 or the MLI structure 720). In some implementations, the IC substrate 710 and the III-V substrate 750 are laterally coupled to one another via the MLI structure 720 (e.g., the metal layers 726 and/or 744) and/or the wire bond 746.

In some implementations, still referring to FIG. 7, the semiconductor substrate 702 includes a region (or portion) 704 that is disposed below (e.g., in the frame of reference of FIG. 7 in which the III-V substrate 750 is proximate an upper end of the circuit module 700 opposite a lower end of the circuit module 700 proximate the substrate 708) the III-V substrate 750. In some implementations, vertical boundaries of the region 704 are aligned, or substantially aligned, with vertical sidewalls of the III-V substrate 750 in the X-Z cross-sectional view. In this regard, the III-V substrate 750 can be defined by a width W1 along the X-axis, and the region 704 of the semiconductor substrate 702 can be defined by a width W2 along the X-axis. In some implementations, the width W2 is substantially the same as the width W1. This may be the case when the III-V substrate 750 is epitaxially grown on the semiconductor substrate 702. In some implementations, the width W2 is slightly larger than the width W1 by about 1 μm to about 10 μm, for example. This may be the case when the III-V substrate 750 is coupled (or bonded) to the semiconductor substrate 702 by the solder bonding layer 770. In some implementations, the region 704 is defined by a thickness T, which is a distance extending from the back side of the III-V substrate 750 to the back side of the semiconductor substrate 702.

In some implementations, one or more TSVs 762 and 764 can be in the semiconductor substrate 702, including being positioned in the region 704. For example, as depicted in FIG. 7, the region 704 includes an array 760 of TSVs extending vertically along the Z-axis through the semiconductor substrate 702 to stop on the second side 702*b* of the semiconductor substrate 702. The array 760 can include more than one TSV, e.g., TSVs 762 and/or 764, separated from one another along the X-axis and the Y-axis (not depicted in FIG. 7). In some implementations, the TSVs 762 and 764 are arranged in a configuration such that two neighboring TSVs (e.g., two neighboring TSVs 762, two neighboring TSVs 764, or neighboring TSVs 762 and 764) are separated by a pitch P, which can be a distance between approximate centers of two neighboring TSVs along the X-axis and Y-axis, respectively. In some implementations, the TSVs 762 and 764 each extend a height H along the Z-axis, where the height H is less than the thickness T of the region 704. In some implementations, a ratio of the height H to the thickness T can be between about 2:3 and about 99:100. For example, the ratio of the height H to the thickness T may be about 95:100, where the height H may be about 95 μm and the thickness T may be about 100 μm. In some implementations, the TSVs 762 and 764 each have a diameter D in an X-Y cross-sectional view along line AA' (see FIG. 10 described in detail below). In some implementations, the array 760 can include any number of the TSVs 762, the TSVs 764, or combinations of both. For purposes of illustration, the number of the TSVs 762 and/or 764 can be defined as N. As described further herein, the TSVs 762 and 764 can be sized and arranged to facilitate improved heat transfer and dissipation through and out of the circuit module 700, such as to facilitate more uniform thermal expansion of the semiconductor substrate 702 and the III-V substrate 750 in response to heat in and around the circuit module 700.

In some implementations, the TSVs 762 and 764 are configured with the same, or substantially the same, dimensions with respect to the height H, the diameter D, and the pitch P. Additionally, the TSVs 762 and/or 764 extend through the semiconductor substrate 702 to stop on the back side of the semiconductor substrate 702. In some implementations, both the TSVs 762 and 764 can be similar to the TSV 732 described above with respect to composition and method of formation. For example, at least one of the TSVs 762 and 764 can each include copper (disposed over a seed layer in some implementations) and be formed by a series of patterning, deposition, and/or planarization processes described above.

In some implementations, the TSV 762 differs from the TSV 764 in terms of their coupling (or the lack thereof) to the III-V substrate 750. For example, the TSV 762 is electrically isolated from the III-V substrate 750 and the TSV 764 is coupled to the III-V substrate 750. With respect to the TSV 762, a portion of the semiconductor substrate 702 is disposed between the TSV 762 and the III-V substrate 750 to provide isolation. In contrast, the TSV 764 is coupled to the III-V substrate 750 (at its first side 750*b*) by one or more vias 754. The vias 754 can be similar to the vias 730 of the MLI structure 720 with respect to composition and method of formation. In some implementations, the vias 754 provide routing options to couple the III-V substrate 750 from its first side 750*b*, which is in addition to the routing options provided by the wire bond 746 and/or the metal layer 744 at its second side 750*a*. In other words, the III-V substrate 750 can be coupled to the substrate 708 without passing through additional interconnect structures, such as the wire bond 746 and/or components of the MLI structure 720.

Figure 10:
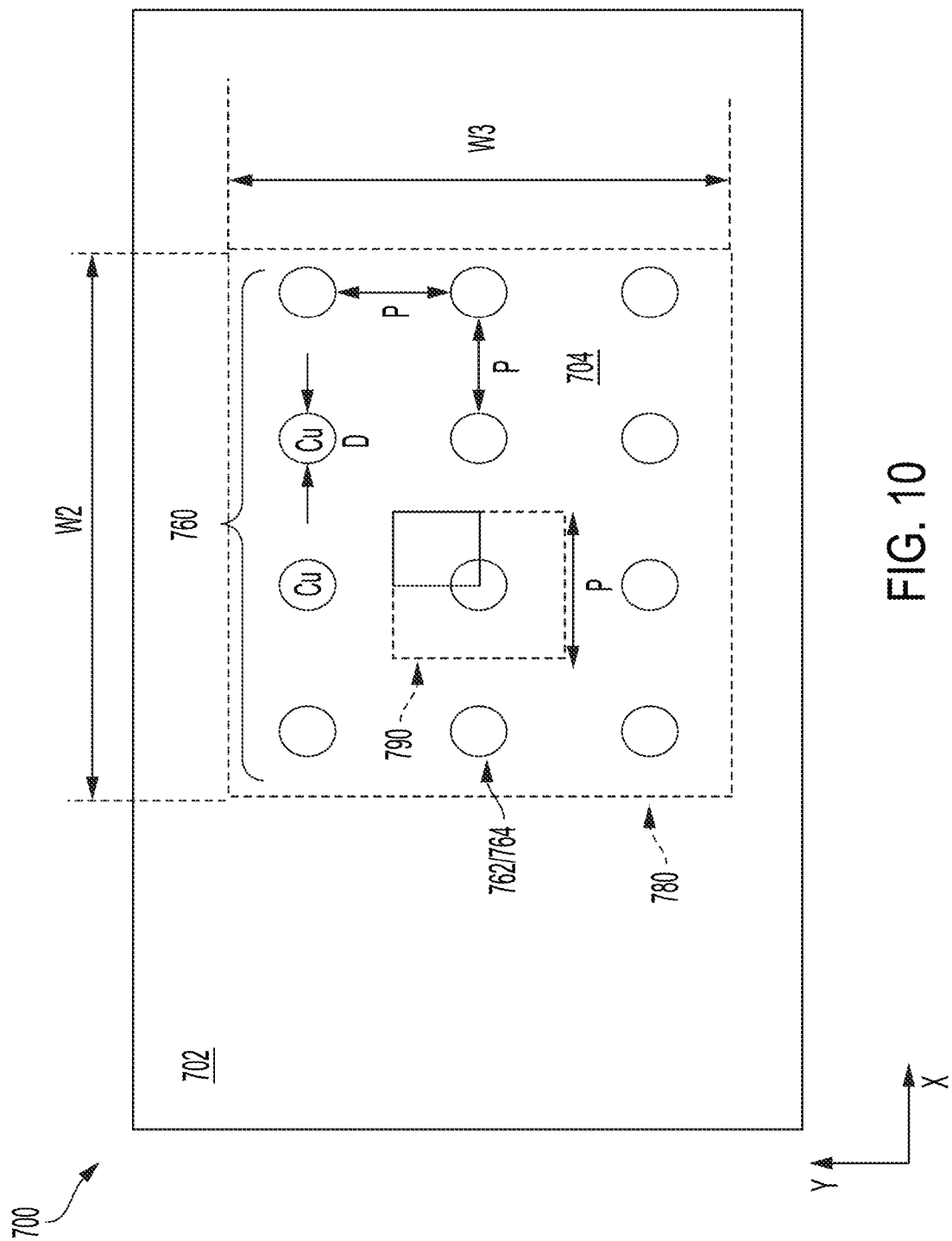
FIG. 10 is a schematic X-Y cross-sectional view of a portion of the circuit module along line AA' of the LIDAR sensor system as depicted in FIG. 7.

FIG. 10 depicts a schematic illustration of an example configuration of the array 760 in the X-Y cross-sectional view along line AA' of FIG. 7. In the depicted implementation, a cross-section of each of the TSVs 762 and 764 is in a circular shape as shown, though the present disclosure is not limited to such configuration and other shapes may also be applicable. In some implementations, an area $A_1$ of the region 704 in the X-Y cross-sectional view is defined by the width W2 measured along the X-axis described above and a width W3 measured along the Y-axis, where $A_1=W2*W3$. In some implementations, the area $A_1$ of the region 704 corresponds to an area of the III-V substrate 750 in the X-Y cross-sectional view.

In some implementations, referring to FIG. 10, the array 760 is arranged in a periodic pattern defined by the pitch P along the X-axis and the Y-axis, and the TSV 762/764 can each be defined by the diameter D. Accordingly, an area $A_2$ of each TSV 762/764 can be defined as $\pi*(D/2)^2$. As shown, the TSVs 762 and/or 764 within the array 760 can be interspersed throughout the region 704 to form a composite structure 780 in the silicon of the semiconductor substrate 702, such that a fraction R of the area $A_1$ occupied by the TSVs in the array 760 corresponds to the extent of such interspersion, where $R=N*A_2/A_1$. In some implementations, the fraction R, which is based on an area calculation, is correlated to a volume fraction of the semiconductor substrate 702 (i.e., the region 704) occupied by the TSVs 762 and/or 764.

Still referring to FIG. 10, the fraction R can be approximated using available fabrication parameters, such as the pitch P and the diameter D, to calculate a ratio of the area $A_2$ of each TSV 762/764 to an area $A_3$ of a sub-region 790 of the region 704 that includes the TSV 762/764. The sub-region 790 can be configured to have a substantially square shape and its area $A_3$ can then be defined as $P^2$. Accordingly, the fraction R can be approximated by $R \sim A_2/A_3 = \pi*(D/2)^2/P^2 = \pi*D/(4P^2)$.

Coefficient of thermal expansion, or CTE, generally describes a material's physical expansion (e.g., increase in physical dimension) in response to elevated temperature and associated heat transfer to the material, and thus can be a thermal feature of that material. For purposes of discussion, "thermal feature," alternatively referred to as "thermal property" or "thermomechanical property," generally describes a mechanical response of a material, such as expansion, contraction, or other changes in shape (e.g., mechanical deformation), to changes in temperature (e.g., thermal stress). For example, a thermal feature/thermal property/thermomechanical property can include a feature or property of a material, such as CTE, detectable by thermomechanical analysis, such as analysis for detecting CTE.

In the present disclosure, the CTE is an approximately linear CTE of a given material at a particular temperature or range of temperatures. Bonding or otherwise coupling two materials having different CTEs can potentially cause mechanical defects, or even failures, at or near a bonding interface when the coupled materials are subjected to thermomechanical stress, such as heat generated by components of the LIDAR sensor system 500 or transferred from an environment around the LIDAR sensor system 500. The III-V semiconductor material in the III-V substrate 750 can have a $CTE_{III-V}$ that is greater than a $CTE_{sub}$ of the semiconductor substrate 702. The mismatch between the $CTE_{III-V}$ and the $CTE_{sub}$ can be addressed by incorporating a plurality of TSVs in the array 760 into the semiconductor substrate 702 to form the composite structure 780, where the TSVs 762 and/or 764 include a conductive material with a $CTE_{TSV}$ that is greater than both the $CTE_{III-V}$ and the $CTE_{sub}$. For example, the circuit module 700 can be made with materials and/or volumes of materials such that the $CTE_{TSV}$ is between about two times and about ten times greater than that of the $CTE_{III-V}$ and/or $CTE_{sub}$.

An effective $CTE_{eff}$ (e.g., composite CTE; combined effective CTE) of the composite structure 780 can correspond to the $CTE_{III-V}$ and the $CTE_{sub}$, adjusted by the fraction R. The effective $CTE_{eff}$ can be an approximately average CTE over a volume of the circuit module 700 or a portion thereof, such as an average CTE of the region 704 resulting from the inclusion of the TSVs 762 and/or 764 in the region 704. For example, by modeling and experiment, the $CTE_{eff}$ of the composite structure 780 at room temperature can be approximated as an approximately linear function $CTE_{eff} = R*CTE_{TSV} + (1-R)*CTE_{sub}$. Given particular values of the $CTE_{sub}$ and the $CTE_{TSV}$, the mismatch in CTE between the III-V substrate 750 and the semiconductor substrate 702 can be reduced by tuning the fraction R to achieve a $CTE_{eff}$ that is within a target threshold (e.g., a threshold greater than zero percent and less than or equal to about ten percent, or 0%<target threshold≤10%) of the $CTE_{III-V}$, which is the CTE of the material included in the III-V substrate 750.

Figure 12:
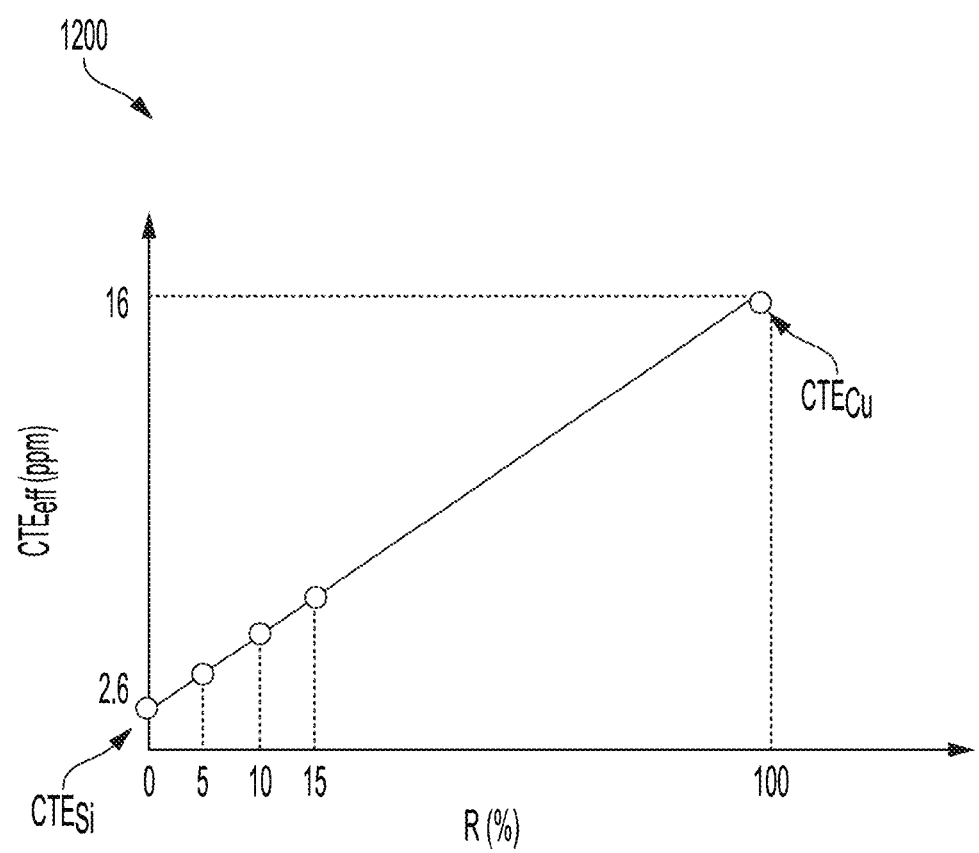
FIG. 12 is a schematic relationship between effective $CTE_{eff}$ of a silicon substrate and an amount of TSVs included in the silicon substrate.

For example, referring to Table 1100 of FIG. 11, at room temperature copper (Cu) has a $CTE_{Cu}$ of about 16 ppm, GaAs has a $CTE_{GaAs}$ of about 5.7 ppm, InP has a $CTE_{InP}$ of about 4.5 ppm, and silicon (Si) has a $CTE_{Si}$ of about 2.6 ppm, i.e., $CTE_{Si} < CET_{III-V} < CTE_{Cu}$. When the TSVs 762 and/or 764 include copper and the semiconductor substrate 702 includes silicon, the effective $CTE_{eff}$ can be approximated by $R*CTE_{Cu} + (1-R)*CTE_{Si}$. In this regard, if the fraction R is 5%, then the effective $CTE_{eff}$ is about 3.27; if the fraction R is 10%, then the effective $CTE_{eff}$ is about 3.94; and if the fraction R is 15%, then the effective $CTE_{eff}$ is about 4.61. Thus, increasing the fraction R increases the effective $CTE_{eff}$ and reduces a mismatch (or difference), $\Delta CTE$, between the effective $CTE_{eff}$ and the $CTE_{III-V}$ (e.g., the $CTE_{GaAs}$, the $CTE_{InP}$, or the $CTE_{InAs}$). The fraction R can be selected to ensure that the $\Delta CTE$ is kept below a target threshold across the region 704 (e.g., as compared with a step function-like transition in CTE from the semiconductor substrate 702 and III-V substrate 750, the fraction R can facilitate transitions in CTE between materials of the circuit module 700 that are lesser in absolute value and in gradient). In some examples, the fraction R may be at least about 5% to about 15% to facilitate the robust coupling between the semiconductor substrate 702 and the III-V substrate 750. The fraction R can be selected such that the effective $CTE_{eff}$ is between about one time and two times that of the $CTE_{Si}$, and between about one fifth and two thirds of that of the $CTE_{InP}$ or the $CTE_{GaAs}$. Other values of the fraction R may also be applicable depending on composition and/or dimension of one or more of the semiconductor substrate 702, the III-V substrate 750, and the TSVs 762/764. FIG. 12 illustrates a schematic plot 1200 of the approximately linear relationship between the effective $CTE_{eff}$ and the fraction R described herein.

In some examples, the effective $CTE_{eff}$ of the composite structure 780 can vary across a volume of the region 704, depending on size metrics of the TSVs 762 and/or 764. For example, the height H may differ between different TSVs 762 and/or 764 in the array 760, such that the volume fraction, which can be estimated by the fraction R, occupied by the TSVs in the region 704 varies along the Z-axis, giving rise to a gradient of effective $CTE_{eff}$ across the region 704.

The vias 754 can also contribute to the calculation of the effective $CTE_{eff}$ in a manner similar to the TSVs 762 and/or 764. For example, the composition (i.e., a specific value of CTE of the vias 754) and distribution (i.e., the fraction R) of the vias 754 can also be tuned to adjust the effective $CTE_{eff}$ of the composite structure 780 for improved heat transfer and dissipation through and out of the circuit module 700 in response to heat generated in and around the circuit module 700.

Figure 8:
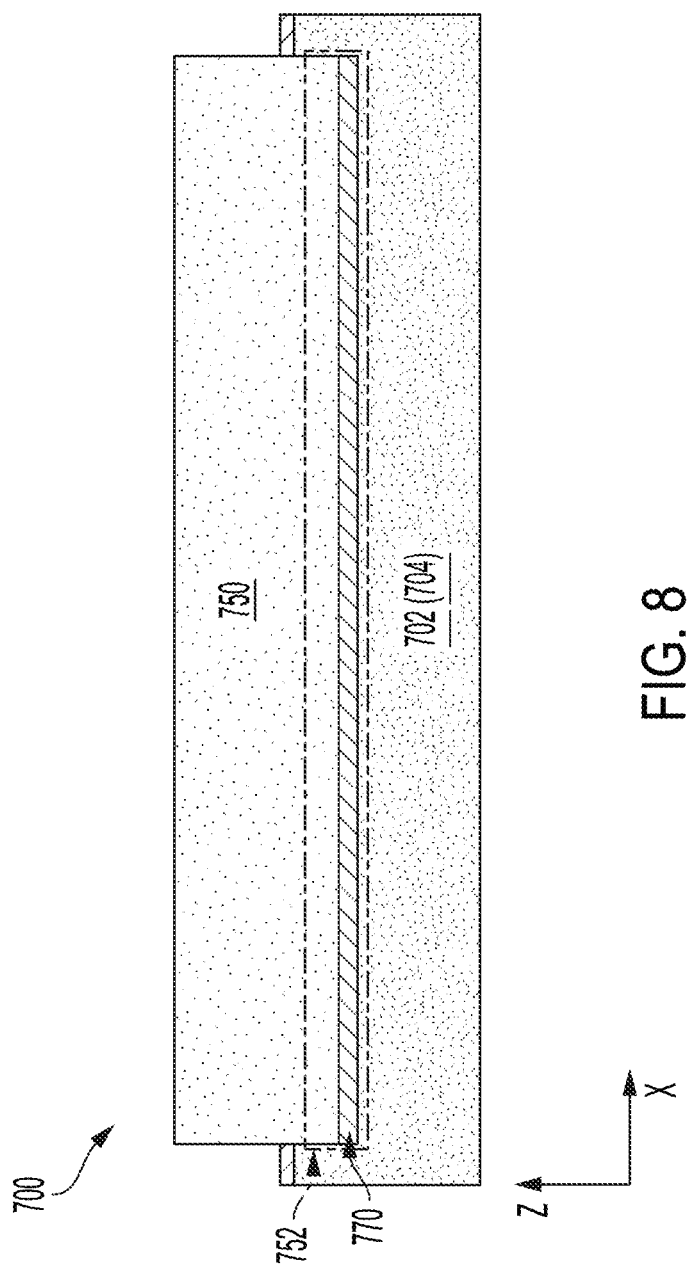
FIG. 8 is a schematic cross-sectional view of a portion of the circuit module of the LIDAR sensor system as depicted in FIG. 7.
Figure 9:
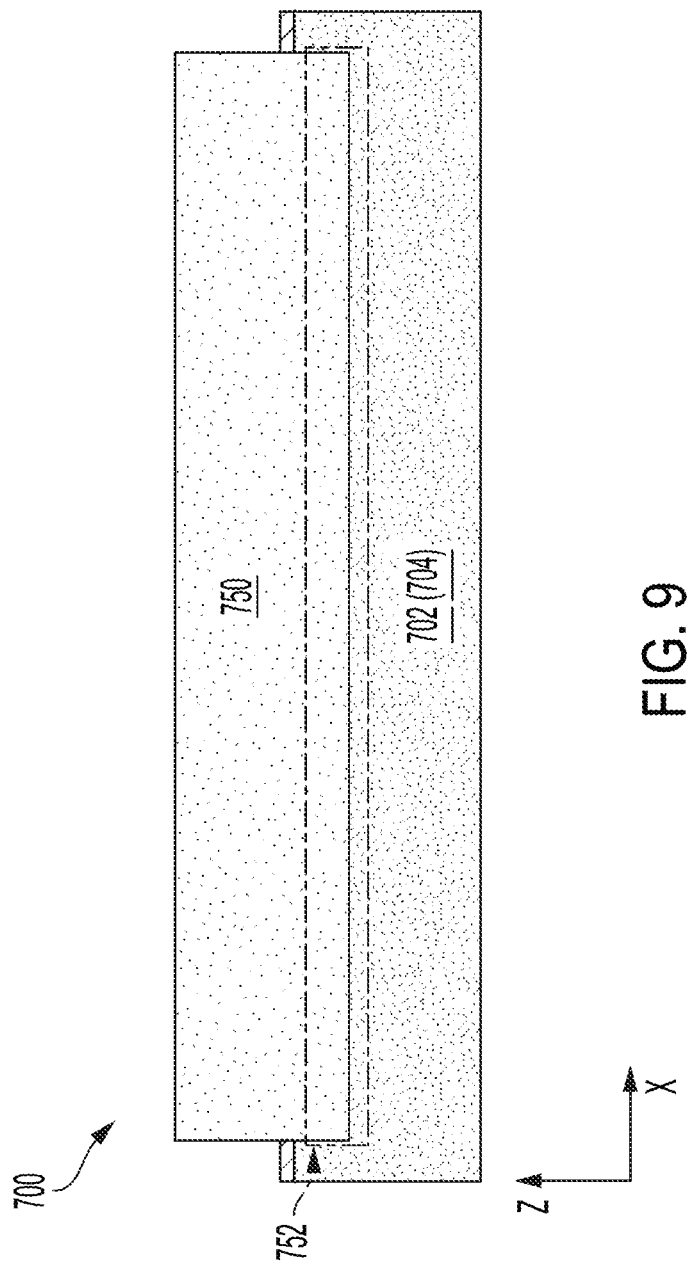
FIG. 9 is a schematic cross-sectional view of a portion of the circuit module of the LIDAR sensor system as depicted in FIG. 7.

Additionally, in examples in which the solder bonding layer 770 is used to couple the III-V substrate 750 to the semiconductor substrate 702 (as depicted in FIG. 8), a material having a CTE that is greater than the $CTE_{sub}$ (e.g., the $CTE_{Si}$) can be selected for the solder bonding layer 770 to accommodate any thermal expansion at or near the bonding interface 752. In this regard, the $\Delta CTE$ in a portion of the region 704 near the bonding interface 752 can be reduced by a different amount than in a portion of the region 704 away from the bonding interface 752 (e.g., the portion that includes the array 760), depending on the material selected for and an area of the solder bonding layer 770. In other words, the effective $CTE_{eff}$ can be tuned independently in different locations of the composite structure 780 to achieve the target threshold in the reduction of the ΔCTE. In some examples, the solder bonding layer 770 can include gold and/or silver, which can each have a CTE different from that of copper but greater than that of silicon.

Figure 13:
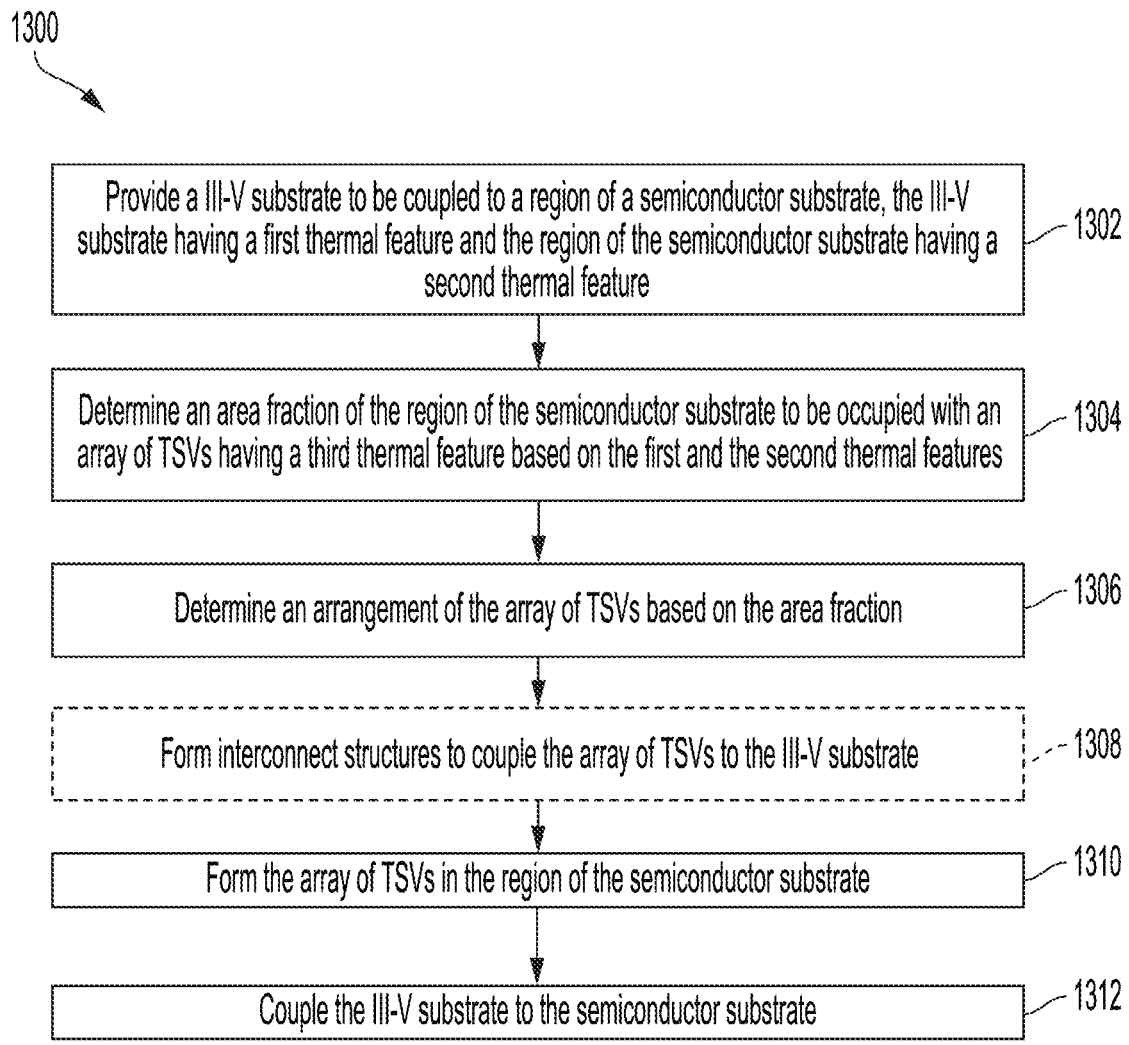
FIG. 13 is a flow diagram showing an example of a method of integrating semiconductor substrates in a circuit module of a LIDAR sensor system.

FIG. 13 illustrates a flow diagram of a method 1300 for integrating the III-V substrate 750 with the semiconductor substrate 702, which can be further coupled to other devices. The method 1300 is merely an example and is not intended to limit the present disclosure. Accordingly, it is understood that additional operations may be provided before, during, and after the method 1300.

At 1302, the III-V substrate 750 can be coupled to the region 704 of the semiconductor substrate 702. The III-V substrate 750 can include a III-V semiconductor material, such as GaAs, InP, InAs, or combinations thereof, having the $CTE_{III-V}$ (at room temperature, for example), and the semiconductor substrate 702 includes silicon, having the $CTE_{Si}$ that is less than the $CTE_{III-V}$ according to the Table 1100, for example. The semiconductor substrate 702 can include the MLI structure 720 embedded therein and other active and/or passive devices coupled thereto. In some implementations, the semiconductor substrate 702 can be coupled to the substrate 708 via the conductive connectors as shown in FIG. 7.

At 1304, the fraction R of the region 704 in which the array 760 (i.e., the TSVs 762 and/or 764) are provided can be determined. In some implementations, the TSVs 762 and/or 764 include copper having the $CTE_{Cu}$, a value of which can be found in the Table 1100. As described above, the $CTE_{eff}$ of the resulting composite structure 780 in the region 704 varies linearly with the fraction R and depends on at least the $CTE_{Si}$ and the $CTE_{Cu}$, where $CTE_{eff}=R*CTE_{Cu}+(1-R)*CTE_{Si}$. Given the values of the $CTE_{Si}$ and the $CTE_{Cu}$ as shown the Table 1100, $CTE_{eff}=2.6+13.4*R$. To reduce the ΔCTE between the $CTE_{eff}$ and the $CTE_{III-V}$ (e.g., the $CTE_{GaAs}$, the $CTE_{InP}$, or the $CTE_{InAs}$), e.g., to tune the $CTE_{eff}$ to be approximately the same as the $CTE_{III-V}$, R can be calculated as $(CTE_{III-V}-2.6)/13.4$. For example, if the III-V substrate 750 includes InP, which has the $CTE_{InP}$ of about 4.5, then the fraction R is approximately 0.142 or 14.2% to arrive at a $CTE_{eff}$ of about 4.5. It is noted that the value of 0.142 for the fraction R is for illustration purposes only and not intended to limit the present disclosure thereto.

In some implementations, thermomechanical stress due to ΔCTE between the $CTE_{Si}$ and the $CTE_{III-V}$ can still be relieved even if the $CTE_{eff}$ is slightly less than the $CTE_{III-V}$. For example, if the III-V substrate 750 includes InP, a $CTE_{eff}$ of about 3.27 may be obtained if the fraction R is tuned to about 0.05 or 5%. While 3.27 is still less than 4.5, it is still greater than the $CTE_{Si}$ and therefore capable of reducing the thermomechanical stress at the bonding interface 752.

At 1306, an arrangement of the TSVs 762 and/or 764 in the array 760 based on the calculated fraction R can be determined. In practice, as one of the two dimensions, the diameter D and the pitch P, can be determined based on manufacturing conditions and/or predefined design requirements, the other one of the dimensions can be determined based on the fraction R and the relationship $R\sim\pi*(D/2)2/P2=\pi*D/(4P2)$ described in detail above. The diameters D and the pitch P can then be used to determine the size and distribution of the array 760 of TSVs.

At 1308, the vias 754 can be formed in the region 704 to couple the TSVs 764 to the III-V substrate 750. In some implementations, the vias 754 are similar to the vias 730 with respect to the composition and method of formation as described in detail above. For implementations in which the array 760 does not include any TSV 764, the formation of the vias 754 can be omitted.

At 1310, the TSVs 762 and/or 764 can be formed according to the calculated fraction R. In some implementations, the TSVs 762 and/or 764 are similar to the TSV 732 with respect to the composition and method of formation as described in detail above. For example, the second side 702b of the semiconductor substrate 702 can be patterned in accordance to the diameter D and the pitch P of the TSVs 762 and/or 764, which are at least partially determined based on the fraction R. In some implementations, the TSVs 762 and/or 764 are formed together with the TSV 732 (and other TSVs in the semiconductor substrate 702) to simplify the manufacturing process.

In some implementations, the TSVs 762 are formed to extend from the second side 702a of the semiconductor substrate 702, at least partially through the semiconductor substrate 702, such that a portion of the semiconductor substrate 702 remains between the TSVs 762 and the III-V substrate 750. In some implementations, the TSVs 764 can be formed to extend through the semiconductor substrate 702 to contact the vias 754, which couple the TSVs 764 to the III-V substrate 750. In some implementations, the TSVs 762 and/or 764 can be formed before, during, or after the formation of various devices (e.g., transistors, capacitors, resistors, etc.) on or coupled to the semiconductor substrate 702. In some implementations, the TSVs 762 and/or 764 can be formed before, during, or after the coupling of the III-V substrate 750 to the semiconductor substrate 702.

At 1312, the III-V substrate 750 is coupled to the semiconductor substrate 702. In some implementations, the III-V substrate 750 is coupled to the semiconductor substrate 702 by forming the solder bonding layer 770 at the bonding interface 752 as illustrated in FIG. 8. In some implementations, the solder bonding layer 770 can be thermally activated at a temperature of at least 300° C. to bond the III-V substrate 750 to the semiconductor substrate 702. In some implementations, the III-V substrate 750 can be epitaxially grown onto the semiconductor substrate 702. In this regard, the method 1300 can pattern the front side of the semiconductor substrate 702 to form a recess, perform an epitaxial growth process to grow a III-V semiconductor layer including GaAs, InP, and/or InAs, for example, from the semiconductor substrate 702. The epitaxial growth process can be implemented by any suitable method, such as molecular beam epitaxy (MBE), CVD (e.g., metal organic CVD, or MOCVD), other suitable methods, or combinations thereof. Devices can then be formed on or coupled to the III-V semiconductor layer.

In some implementations, additional fabrication processes are performed. For example, the method 1300 can form additional devices of the circuit module 700 on or to couple to the semiconductor substrate 702, where the additional devices can be configured to perform various functions of the LIDAR system 500. Additionally or alternatively, the method 1300 can form components (e.g., bonding layers, gap fill layers, etc.) to complete formation of the circuit module 700 as a semiconductor IC package.

FIGS. 14-17 depict examples of a circuit module 1400 configured to perform a plurality of functions in the LIDAR sensor system 500. The circuit module 1400 can incorporate features of various circuit modules described herein, including but not limited to the circuit module 700. In this regard, components of the circuit module 1400 that are the same those of the circuit module 700 are described using the same reference numerals.

Figure 14:
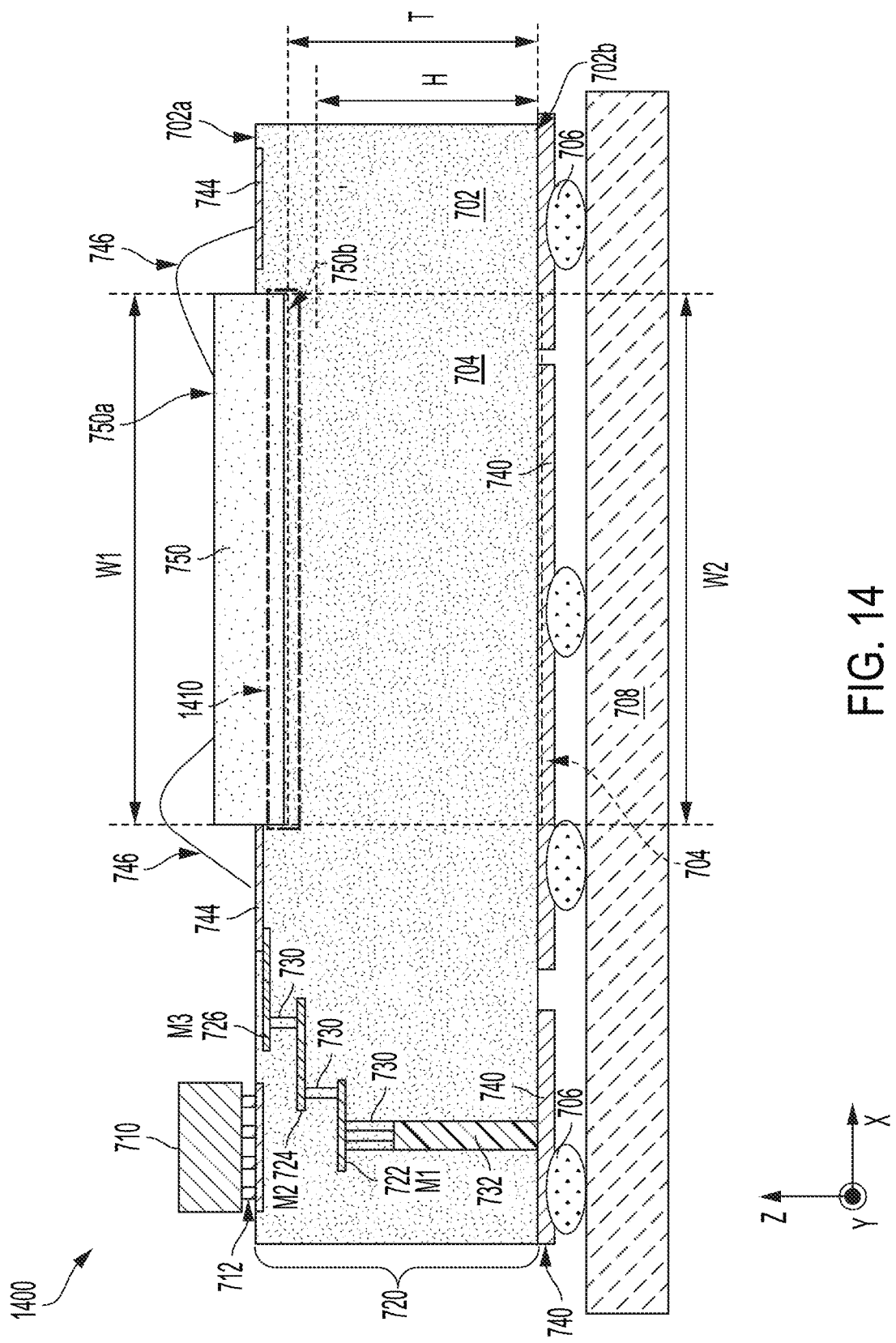
FIG. 14 is a schematic cross-sectional view of an example of a circuit module, in portion or in entirety, of a LIDAR sensor system.
Figure 17:
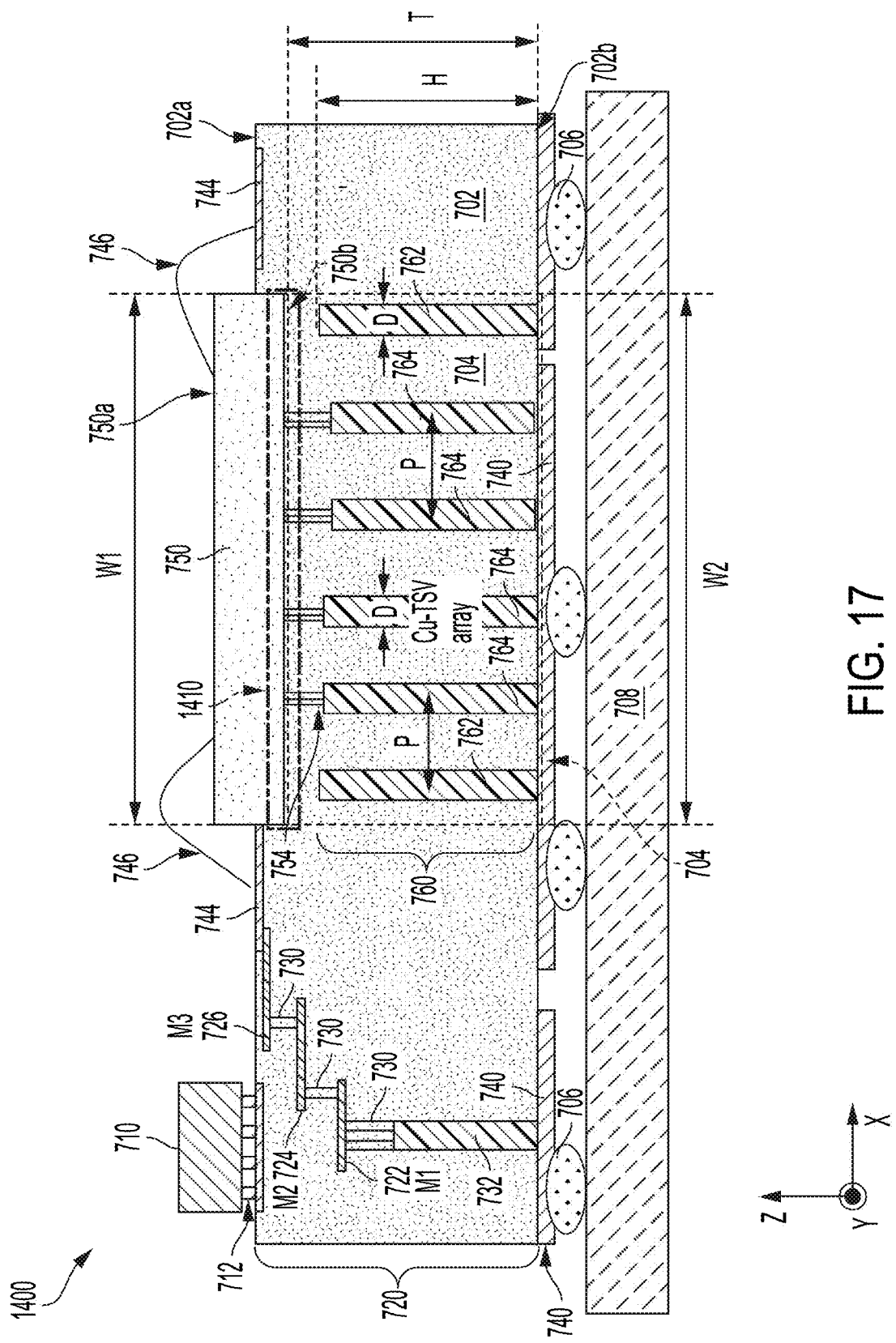
FIG. 17 is a schematic cross-sectional view of a portion of the circuit module of the LIDAR sensor system as depicted in each of FIG. 14 and FIG. 15.

For example, the circuit module 1400 can include a III-V semiconductor circuitry on a III-V semiconductor substrate (e.g., a III-V substrate) coupled to at least one of silicon photonics circuitry or PLC. Referring to FIGS. 14 and 17, the circuit module 1400 can include at least one integrated circuit (IC) substrate (e.g., an IC die or an IC chip) 710 and at least one III-V substrate (e.g., a III-V chip or a III-V die) 750 coupled to the semiconductor substrate 702, which can be further coupled to the substrate 708.

As described above with respect to the circuit module 700, the semiconductor substrate 702 has a composition different from that of the III-V substrate 750. For example, the semiconductor substrate 702 can include silicon and can be free, or substantially free, of any III-V semiconductor materials, such as GaAs, InAs, and InP. Such a difference in composition can lead to a mismatch in CTE between the semiconductor substrate 702, having the $CTE_{sub}$, and the III-V substrate 750, having the $CTE_{III-V}$ generally greater than the $CTE_{sub}$, potentially causing mechanical defects at or near a bonding interface therebetween under thermal stress.

In some implementations, as shown in at least FIG. 7, the mismatched CTEs in the circuit module 700 can be reduced by embedding the TSVs 762/764, which have the higher $CTE_{TSV}$ than the $CTE_{sub}$, in a region 704 of the semiconductor substrate 702 to form the composite structure 780 contacting with or corresponding to the III-V substrate 750. In this regard, the effective, or composite, $CTE_{eff}$ of the composite structure 780 is increased to a value similar to (e.g., within a target threshold of) the $CTE_{III-V}$, thereby reducing the mismatch in CTE at the bonding interface 752 in an effort to mitigate potential mechanical defects in the circuit module 700 and improve the overall produce yield and reliability.

In some implementations, as shown in FIGS. 14-17 collectively, the circuit module 1400 includes a bonding interface 1410 having a composite structure configured to reduce the mismatch in CTE between the semiconductor substrate 702 and the III-V substrate 750, such that an effective $CTE_{eff\_1430}$ of the composite structure is increased to a value similar to the $CTE_{III-V}$. In some implementations, the effective $CTE_{eff\_1430}$ is within a target threshold that is greater than zero percent and less than or equal to about ten percent of the $CTE_{III-V}$.

The bonding interface 1410 extends across a portion of the III-V substrate 750 (at its first side 750b) along the X-axis, such that a lower portion of the III-V substrate 750 is embedded in an upper portion of the semiconductor substrate 702. The region 704 of the semiconductor substrate 702 is positioned below the III-V substrate 750, where the III-V substrate 750 proximate to an upper end of the circuit module 1400 is opposite to a lower end of the circuit module 1400 proximate the substrate 708. In this regard, the bonding interface 1410 couples the region 704 of the semiconductor substrate 702 to the III-V substrate 750 in a manner similar to the bonding interface 752 depicted in FIGS. 7-9. However, the bonding interface 752 and the bonding interface 1410 may be configured with different materials.

Furthermore, in some implementations, such as depicted in FIG. 14, the circuit module 1400 differs from the circuit module 700 in that the circuit module 1400 may include fewer or no TSVs 762 or 764 embedded in the semiconductor substrate 702 (as compared with the circuit module 700 depicted in FIG. 7). In this regard, the structure and composition of semiconductor substrate 702 within the region 704 can be the same, or substantially the same, as that outside the region 704. As will be described in detail below, the increase in the effective $CTE_{eff\_1430}$ of the region 704 can be attributed to the structure and composition of the bonding interface 1410.

Figure 15:
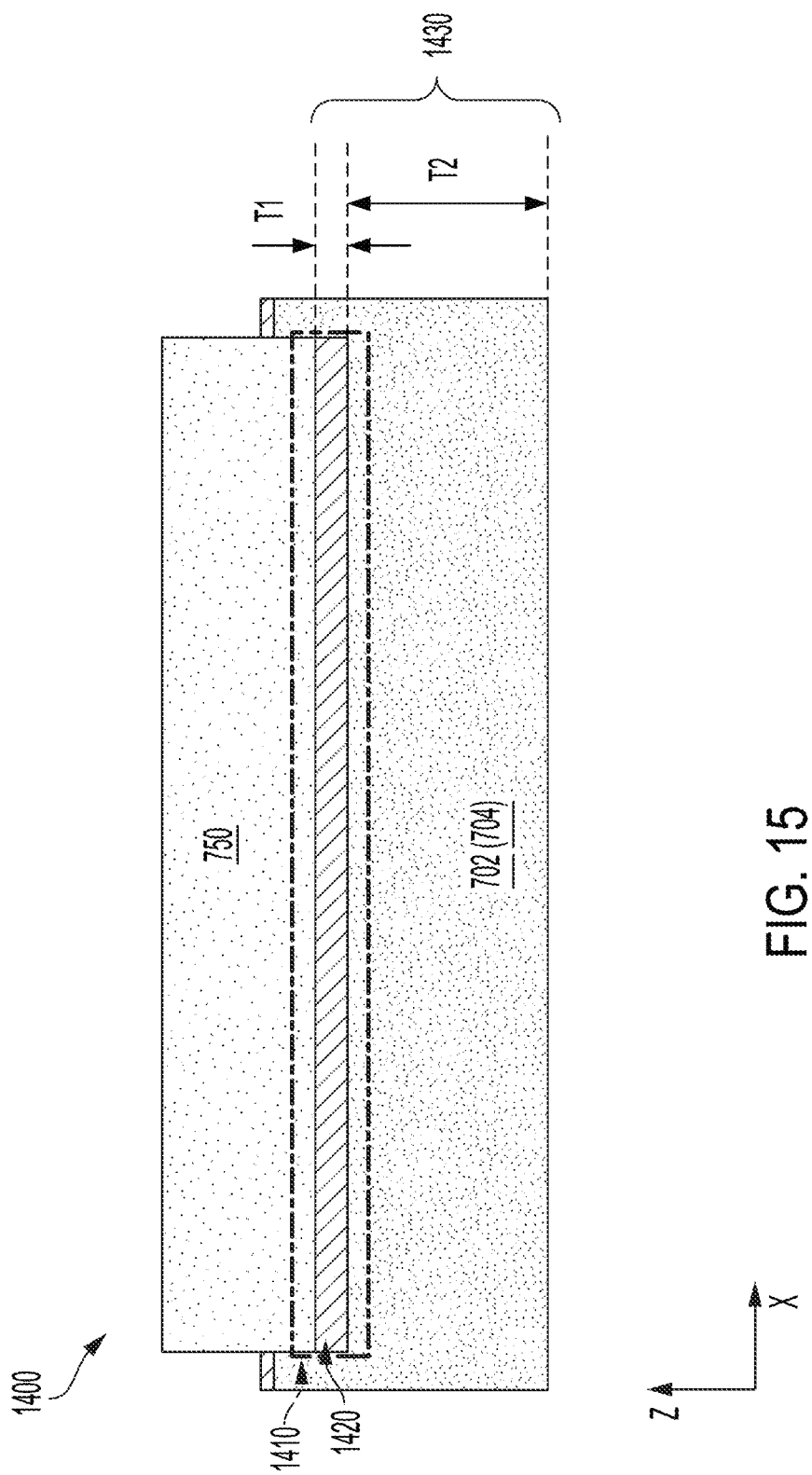
FIG. 15 is a schematic cross-sectional view of an example of a circuit module, in portion or in entirety, of a LIDAR sensor system.

In some implementations, referring to FIG. 15, which depicts a detailed cross-sectional view of the bonding interface 1410 as shown in FIG. 14, the bonding interface 1410 includes a metal bonding layer 1420 disposed between the semiconductor substrate 702 and the III-V substrate 750, where the metal bonding layer 1420 and the region 704 of the semiconductor substrate 702 form a composite structure 1430. The metal bonding layer 1420 can include any suitable material with a $CTE_{metal}$ that is significantly larger than the $CTE_{sub}$ (e.g., the $CTE_{metal}$ may be at least about three times, such as about six times, the $CTE_{sub}$). In some implementations, the $CTE_{metal}$ is also significantly larger than the $CTE_{III-V}$ (e.g., the $CTE_{metal}$ may be at least about two times, such as three times, the $CTE_{III-V}$). In some implementations, the metal bonding layer 1420 and the TSVs 762 and 764 have similar or the same compositions. For example, the metal bonding layer 1420 can include Cu such that the $CTE_{metal}$ is equivalent to the $CTE_{Cu}$. For implementations in which the semiconductor substrate 702 includes Si, the $CTE_{sub}$ is equivalent to $CTE_{Si}$. For implementations in which the III-V substrate 750 includes GaAs, the $CTE_{III-V}$ is equivalent to $CTE_{GaAs}$. Furthermore, still referring to FIG. 16, the metal layer 1420 has a thickness T1 and the semiconductor substrate 702 has a thickness T2, where the thicknesses T1 and T2 are measured along the Z-axis.

Analogous to the calculation of the effective $CTE_{eff}$ of the composite structure 780 described above, the effective $CTE_{eff\_1430}$ of the composite structure 1430 at room temperature can be determined as an approximately linear function $CTE_{eff\_1430}=R_{metal}*CTE_{metal}+(1-R_{metal})*CTE_{sub}$, where a fraction $R_{metal}$ is correlated to a volume fraction of the metal bonding layer 1420 in the composite structure 1430. In some implementations, assuming a planar area (area in the X-Y plane from a top view, for example) occupied by the metal bonding layer 1420 is substantially the same as that of the semiconductor substrate 702, the fraction $R_{metal}$ can be approximated as a ratio of the thickness T1 to a sum of the thicknesses T1 and T2, or $R_{metal}$~T1/(T1+T2). Furthermore, as the $CTE_{metal}$ is significantly larger than both the $CTE_{eff\_1430}$ and the $CTE_{sub}$, the thickness T1 is generally less than the thickness T2 according to the approximately linear function provided herein.

In this regard, reducing the mismatch in CTE between the semiconductor substrate 702 and the III-V substrate 750 can then be achieved by tuning the fraction $R_{metal}$ (e.g., tuning the thicknesses T1 and/or T2) that would result in an effective $CTE_{eff\_1430}$ within the target threshold of the $CTE_{III-V}$. In some implementations, the semiconductor substrate 702 includes Si, the metal bonding layer 1420 includes Cu, and the III-V substrate 750 includes GaAs such that $CTE_{eff\_1430}$~$CTE_{GaAs}=R_{metal}*CTE_{Cu}+(1-R_{metal})*CTE_{Si}$, where the fraction $R_{metal}$ is approximated to be 23.1% based on the example values provided in FIG. 11. In some implementations, the fraction $R_{metal}$ generally decreases with a decreasing $CTE_{III-V}$. For example, if the III-V substrate 750 includes InP, which has a $CTE_{InP}$ of about 4.5 that is less than the $CTE_{GaAs}$, the fraction $R_{metal}$ is approximated to be 14.2%.

Accordingly, by tuning the thicknesses T1 and/or T2 to obtain a suitable fraction $R_{metal}$, the effective $CTE_{eff\_1430}$ of the composite structure 1430 can be configured to be similar to the $CTE_{III-V}$ within the target threshold described above (e.g., reducing the mismatch between the effective $CTE_{eff\_1430}$ and the $CTE_{III-V}$), thereby reducing the mechanical defects, or even failures, that may occur at or near the bonding interface 1410. In some implementations, reducing the mismatch in CTE helps mitigate thermal stress, such as heat generated by components of the LIDAR sensor system 500 or transferred from an environment around the LIDAR sensor system 500, exerted to the circuit module 1400.

It is noted that, although the present disclosure provides a method of approximating the fraction $R_{metal}$ based on the thicknesses T1 and T2, other methods of determining the fraction $R_{metal}$ may also be employed. For example, the fraction $R_{metal}$ may be determined by directly measuring a volume of the metal bonding layer 1420 and a volume of the semiconductor substrate 702.

In some implementations, the metal bonding layer 1420 is patterned to form one or more optical windows (not depicted) for exposing grating couplers of a silicon photonic circuitry formed over the semiconductor substrate 702. The metal bonding layer 1420 may be etched or punched out to form a suitable pattern that functions as an optical window. In this regard, any portions of the metal bonding layer 1420 removed to form such a pattern can be figured into (e.g., by subtraction, for example) the fraction $R_{metal}$ (e.g., determined by direct measurement) to obtain the effective $CTE_{eff\_1430}$ accordingly.

Figure 16:
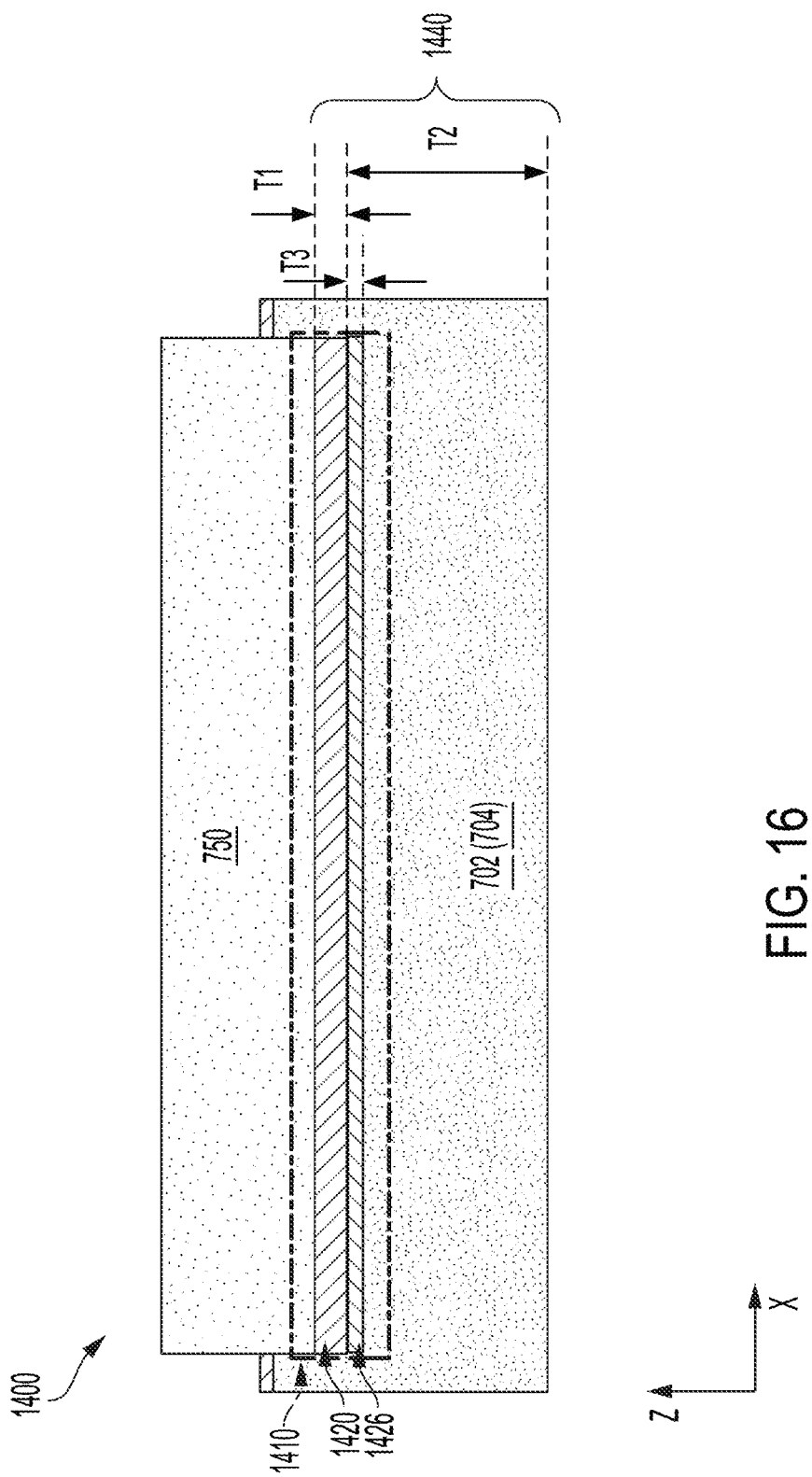
FIG. 16 is a schematic cross-sectional view of a portion of the circuit module of the LIDAR sensor system as depicted in each of FIG. 14 and FIG. 15.

In some implementations, referring to FIG. 16, which depicts a detailed cross-sectional view of the bonding interface 1410 as shown in FIG. 14, the bonding interface 1410 includes the metal bonding layer 1420 disposed between the semiconductor substrate 702 and the III-V substrate 750. The bonding interface 1410 further includes an optional solder bonding layer 1426 disposed between the metal bonding layer 1420 and the semiconductor substrate 702, such that the semiconductor substrate 702, the metal bonding layer 1420 and the solder bonding layer 1426 together constitute a composite structure 1440. In some implementations, the solder bonding layer 1426 facilitates the bonding or coupling between the metal bonding layer 1420 and the semiconductor substrate 702, similar to the function of the solder bonding layer 770 described in detail above.

The solder bonding layer 1426 can be similar to the solder bonding layer 770 in composition. For example, the solder bonding layer 1426 can include Au, Ag, AuSn alloy, or combinations thereof. In some implementations, the solder bonding layer 1426 has a $CTE_{solder}$ different from the $CTE_{metal}$ and has a thickness T3 less than the thickness T1. Accordingly, to reflect the inclusion of the solder bonding layer 1426 in the determination of an effective $CTE_{eff\_1440}$ of the composite structure 1440, a modified term $R_{metal+AuSn}*CTE\hat{\ }$ replaces the term $R_{metal+AuSn}*CTE_{metal}$ in the approximately linear function provided herein. In some implementations, the fraction $R_{metal+AuSn}$ is approximated as $R_{metal+AuSn}\sim(T1+T3)/(T1+T2+T3)$. Similar to the manner that the effective $CTE_{eff\_1430}$ is determined as a composite value based on the $CTE_{metal}$, the $CTE_{sub}$, the thickness T1, and the thickness T2, the $CTE\hat{\ }$ can also be determined as a composite value based on the $CTE_{metal}$, the $CTE_{solder}$, the thickness T1, and the thickness T3.

In some implementations, the thickness T3 is significantly less than the thickness T1 such that the effect of the $CTE_{solder}$ on the $CTE\hat{\ }$ is substantially negligible. In this regard, the effective $CTE_{eff\_1440}$ of the composite structure 1440 can be equated to the effective $CTE_{eff\_1430}$ of the composite structure 1430 described in detail above.

In some implementations, referring to FIG. 17, the circuit module 1400 additionally includes the array 760 of TSVs embedded in the semiconductor substrate 702. In this regard, the region 704 of the semiconductor substrate 702 positioned below the bonding interface 1410 includes the TSVs 762 and/or 764 extending vertically along the Z-axis through the semiconductor substrate 702, as described in detail with respect to the circuit module 700. In some implementations, the TSVs 762 and 764 can each be optionally coupled to the first side 750b of the III-V substrate 750 by one or more of the vias 754.

In some implementations, the effective $CTE_{eff\_1430}$ of the composite structure 1430 (or 1440), determined based on characteristics of the region 704 and the metal bonding layer 1420 (and the solder bonding layer 1426, if applicable) described above, can benefit from the effective $CTE_{eff}$ of the composite structure 780, which is based on the $CTE_{TSV}$ and the fraction R of the TSVs 762 and/or 764 in the region 704. For instance, the effective $CTE_{eff\_1430}$ of the composite structure 1430 can be determined based on $CTE_{eff\_1430}=R_{metal}*CTE_{metal}+(1-R_{metal})*CTE_{sub}$, where the $CTE_{sub}$ can reflect the CTE of the region 704 without any TSVs, as depicted in FIG. 14. Alternatively, referring to FIG. 17, the $CTE_{sub}$ can be a composite CTE that takes into account the TSVs 762 and/or 764 embedded in the region 704.

Accordingly, in some implementations, increasing the effective $CTE_{eff\_1430}$ to a value within the target threshold of the $CTE_{III-V}$ can be accomplished by incorporating the metal bonding layer 1420 (as shown in FIG. 14). In some implementations, increasing the effective $CTE_{eff\_1430}$ can be accomplished by incorporating a combination of the metal bonding layer 1420 and the TSVs 762 and/or 764 (as shown in FIG. 17). For both scenarios, characteristics (e.g., the material of the metal bonding layer 1420, the material of the TSVs 762 and/or 764, the thicknesses T1 and T2, the size of the TSVs 762 and/or 764, etc.) of the components of the circuit module 1400 can be tuned independently or collectively to arrive at a suitable effective $CTE_{eff\_1430}$ for reducing the mismatch in CTE between the semiconductor substrate 702 and the III-V substrate 750.

Having now described some illustrative implementations, it is apparent that the foregoing is illustrative and not limiting, having been presented by way of example. In particular, although many of the examples presented herein involve specific combinations of method acts or system elements, those acts and those elements can be combined in other ways to accomplish the same objectives. Acts, elements and features discussed in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular can also embrace implementations including a plurality of these elements, and any references in plural to any implementation or element or act herein can also embrace implementations including only a single element. References in the singular or plural form are not intended to limit the presently disclosed systems or methods, their components, acts, or elements to single or plural configurations. References to any act or element being based on any information, act or element can include implementations where the act or element is based at least in part on any information, act, or element.

Any implementation disclosed herein can be combined with any other implementation or embodiment, and references to "an implementation," "some implementations," "one implementation" or the like are not necessarily mutually exclusive and are intended to indicate that a particular feature, structure, or characteristic described in connection with the implementation can be included in at least one implementation or embodiment. Such terms as used herein are not necessarily all referring to the same implementation. Any implementation can be combined with any other implementation, inclusively or exclusively, in any manner consistent with the aspects and implementations disclosed herein.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Systems and methods described herein may be embodied in other specific forms without departing from the characteristics thereof. Further relative parallel, perpendicular, vertical or other positioning or orientation descriptions include variations within +/−10% or +/−10 degrees of pure vertical, parallel or perpendicular positioning. References to "approximately," "about" "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

The term "coupled" and variations thereof includes the joining of two members directly or indirectly to one another. Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References to "or" can be construed as inclusive so that any terms described using "or" can indicate any of a single, more than one, and all of the described terms. A reference to "at least one of 'A' and 'B'" can include only 'A', only 'B', as well as both 'A' and 'B'. Such references used in conjunction with "comprising" or other open terminology can include additional items.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

What is claimed:

1. A light detection and ranging (LIDAR) sensor system for a vehicle, comprising:
    a circuit module, comprising:
        a silicon substrate having a first coefficient of thermal expansion (CTE) and a first surface opposite a second surface;
        a III-V semiconductor substrate having a third surface opposite a fourth surface, the third surface facing the first surface and coupled to the silicon substrate, the III-V semiconductor substrate having a second CTE;
        an optical device coupled to the III-V semiconductor substrate, the optical device configured to output a transmit beam;
        a plurality of first vias disposed in a particular portion of the silicon substrate that is under the III-V semiconductor substrate, the plurality of first vias extending in the silicon substrate between the first surface and the second surface and towards the third surface, wherein, at least one via of the plurality of first vias has a third CTE; and
        a plurality of second vias each directly coupling a first one of the plurality of first vias to the third surface; and
    a scanner configured to direct the transmit beam to an environment of the vehicle.

2. The LIDAR sensor system of claim 1, wherein a second one of the plurality of first vias is electrically isolated from the III-V semiconductor substrate.

3. The LIDAR sensor system of claim 1, wherein a ratio of a height of a particular one of the plurality of first vias to a thickness of the silicon substrate is between about 2:3 and about 99:100.

4. The LIDAR sensor system of claim 1, wherein the third CTE is between about two times and about ten times greater than the first CTE and the second CTE.

5. The LIDAR sensor system of claim 1, wherein an amount of the plurality of first vias in the particular portion of the silicon substrate is such that the particular portion has a fourth CTE that is between about one time and two times that of the first CTE and between about one fifth and two thirds that of the second CTE.

6. The LIDAR sensor system of claim 5, wherein the fourth CTE is based on a first volume fraction of the plurality of first vias and a second volume fraction of the plurality of second vias in the particular portion of the silicon substrate, and wherein the volume fraction is correlated to a ratio of a first cross-sectional area occupied by the plurality of first vias to a second cross-sectional area occupied by the particular portion of the silicon substrate.

7. The LIDAR sensor system of claim 5, wherein a volume fraction of the particular portion of the silicon substrate filled with the plurality of first vias is between about five percent and about twenty percent.

8. The LIDAR sensor system of claim 1, wherein the plurality of second vias each extend vertically between the first one of the plurality of first vias and the third surface.

9. The LIDAR sensor system of claim 1, wherein the second surface is at a distance from the third surface, and wherein the third surface is coupled to the silicon substrate along a bonding interface.

10. The LIDAR sensor system of claim 1, further comprising an integrated circuit (IC) chip coupled to a portion of the silicon substrate that is different from the particular portion of the silicon substrate.

11. The LIDAR sensor system of claim 1, wherein the III-V semiconductor substrate includes GaAs, InP, or a combination thereof.

12. The LIDAR sensor system of claim 1, wherein at least one first via of the plurality of first vias includes Cu.

13. An autonomous vehicle control system, comprising:
a LIDAR sensor system, comprising:
a circuit module, comprising:
a silicon substrate having a first CTE and a first surface opposite a second surface;
a III-V semiconductor substrate having a third surface opposite a fourth surface, the third surface facing the first surface and coupled to the silicon substrate, the III-V semiconductor substrate having a second CTE;
an optical device coupled to the III-V semiconductor substrate, the optical device configured to output a transmit beam;
a plurality of first vias disposed in a particular portion of the silicon substrate that is under the III-V semiconductor substrate, the plurality of first vias extending in the silicon substrate between the first surface and the second surface and towards the third surface, and each via of the plurality of first vias having a third CTE; and
a plurality of second vias directly coupling a first one of the plurality of first vias to the third surface; and
a scanner configured to direct the transmit beam to an environment of a vehicle; and
one or more processors configured to:
determine at least one of a range to an object or a velocity of an object based on a return beam from at least one of reflection or scattering of the transmit beam by the object; and
control operation of an autonomous vehicle based on the at least one of the range or the velocity.

14. The autonomous vehicle control system of claim 13, wherein the third CTE is between about two times and about ten times greater than the first CTE and the second CTE.

15. The autonomous vehicle control system of claim 13, wherein the particular portion of the silicon substrate has a fourth CTE that is greater than the first CTE, and wherein the fourth CTE is based on a first volume fraction of the plurality of first vias and a second volume fraction of the plurality of second vias in the particular portion of the silicon substrate.

16. The autonomous vehicle control system of claim 13, wherein a second one of the plurality of first vias is electrically isolated from the III-V semiconductor substrate.

17. An autonomous vehicle, comprising:
a LIDAR sensor system, comprising:
a circuit module, comprising:
a silicon substrate having a first coefficient of thermal expansion (CTE) and a first surface opposite a second surface;
a III-V semiconductor substrate coupled to the silicon substrate, the III-V semiconductor substrate having a second CTE and a third surface opposite a fourth surface, the third surface directly bonded to the silicon substrate;
an optical device coupled to the III-V semiconductor substrate, the optical device configured to output a transmit beam;
a plurality of first vias disposed in a particular portion of the silicon substrate that is under the III-V semiconductor substrate, the plurality of first vias extending in the silicon substrate between the first surface and the second surface and towards the third surface, and each via of the plurality of first vias having a third CTE; and
a plurality of second vias each directly coupling a first one of the plurality of first vias to the third surface; and
a scanner configured to direct the transmit beam to an environment of a vehicle;
a steering system;
a braking system; and
a vehicle controller comprising one or more processors configured to:
determine at least one of a range to an object or a velocity of the object based on a return beam from at least one of reflection or scattering of the transmit beam by the object; and
control operation of at least one of the steering system or the braking system based on the at least one of the range or the velocity.

18. The autonomous vehicle of claim 17, wherein a second one of the plurality of first vias is electrically isolated from the III-V semiconductor substrate.

19. The autonomous vehicle of claim 17, wherein the particular portion of the silicon substrate has a composite CTE that is between about one time and two times the first CTE of the silicon substrate and between about one fifth and two thirds of the second CTE of the III-V semiconductor substrate.

* * * * *